(12) United States Patent
Matsuda

(10) Patent No.: US 10,568,248 B2
(45) Date of Patent: Feb. 18, 2020

(54) SUCTION NOZZLE AND COMPONENT MOUNTING MACHINE

(71) Applicant: FUJI MACHINE MFG. CO., LTD., Chiryu (JP)

(72) Inventor: Futoshi Matsuda, Obu (JP)

(73) Assignee: FUJI CORPORATION, Chiryu (JP)

(*) Notice: Subject to any disclaimer, the term of this patent is extended or adjusted under 35 U.S.C. 154(b) by 440 days.

(21) Appl. No.: 15/025,411

(22) PCT Filed: Oct. 11, 2013

(86) PCT No.: PCT/JP2013/077744
§ 371 (c)(1),
(2) Date: Mar. 28, 2016

(87) PCT Pub. No.: WO2015/052832
PCT Pub. Date: Apr. 16, 2015

(65) Prior Publication Data
US 2016/0227682 A1  Aug. 4, 2016

(51) Int. Cl.
*H05K 13/04* (2006.01)
*H05K 13/08* (2006.01)

(52) U.S. Cl.
CPC ........ *H05K 13/0408* (2013.01); *H05K 13/08* (2013.01); *Y10T 29/53174* (2015.01)

(58) Field of Classification Search
CPC .............. H05K 13/08; H05K 13/0023; H05K 13/0404; H05K 13/0408; Y10T 29/53174;
(Continued)

(56) References Cited

U.S. PATENT DOCUMENTS 2,903,290 A * 9/1959 Morris .................. A01K 43/00
  294/65
3,610,673 A * 10/1971 Strombeck ............ B66C 1/0212
  294/65
(Continued)

FOREIGN PATENT DOCUMENTS

JP      7-116984 A    5/1995
JP   2009-295946 A   12/2009

OTHER PUBLICATIONS

International Search Report dated Nov. 26, 2013, in PCT/JP2013/077744 Filed Oct. 11, 2013.
(Continued)

*Primary Examiner* — Peter Dungba Vo
*Assistant Examiner* — Kaying Kue
(74) *Attorney, Agent, or Firm* — Oblon, McClelland, Maier & Neustadt, L.L.P.

(57) ABSTRACT

In a suction nozzle held on a mounting head of a component mounting machine, a nozzle section that sucks a component is swingably provided on a nozzle holder section of the suction nozzle, and an orientation of the nozzle section is changed by 90° to a downward orientation or a lateral orientation by swinging the nozzle section. The component is sucked by the nozzle section from above in a state in which the orientation of the nozzle section of the suction nozzle is downward in a component suction operation, and the component is mounted on an object such as a circuit board in a state in which the orientation of the component sucked by the nozzle section is set to the lateral orientation by the nozzle section the orientation of which is changed by 90° to the lateral orientation by swinging the nozzle section in the component mounting operation.

14 Claims, 17 Drawing Sheets

(a)

(b)

(58) Field of Classification Search
CPC ......... Y10T 29/53191; Y10T 29/53083; Y10T 29/53061
USPC .......... 29/743, 744, 739–741, 833, 832, 709
See application file for complete search history.

(56) References Cited

U.S. PATENT DOCUMENTS

| | | | | |
|---|---|---|---|---|
| 4,534,549 A * | 8/1985 | Eberle | ................... | B65H 3/0816 271/103 |
| 4,623,296 A * | 11/1986 | McGuire | ................ | B65G 47/91 156/362 |
| 4,706,379 A * | 11/1987 | Seno | .................... | H05K 13/041 29/740 |
| 5,234,304 A * | 8/1993 | Okumoto | ............. | H05K 13/041 414/223.01 |
| 5,331,731 A * | 7/1994 | Suzuki | ................. | H05K 13/041 29/759 |
| 5,500,997 A * | 3/1996 | Kobayashi | ......... | H05K 13/0409 29/740 |
| 5,636,435 A * | 6/1997 | Okumoto | ........... | H05K 13/0406 29/740 |
| 6,279,225 B1 * | 8/2001 | Martin | ............... | H05K 13/0452 29/740 |
| 7,296,343 B2 * | 11/2007 | Usui | .................. | H05K 13/0452 29/740 |
| 7,350,289 B2 * | 4/2008 | Narita | ................. | H05K 13/0413 29/743 |
| 7,650,691 B2 * | 1/2010 | Narita | ............... | H01L 21/67132 29/740 |
| 9,004,846 B2 * | 4/2015 | La Rovere | ........... | B25J 15/0616 294/65 |
| 2002/0184755 A1 * | 12/2002 | Suhara | ............... | H05K 13/0069 29/833 |
| 2003/0093896 A1 * | 5/2003 | Usui | .................. | H05K 13/0452 29/743 |
| 2004/0020043 A1 * | 2/2004 | Ueno | ................ | H01L 21/67144 29/832 |
| 2005/0246890 A1 * | 11/2005 | Isogai | .................... | H05K 13/04 29/740 |
| 2006/0150404 A1 * | 7/2006 | Van De Ven | ...... | H05K 13/0409 29/834 |
| 2010/0011570 A1 | 1/2010 | Kimura | | |
| 2010/0269330 A1 * | 10/2010 | Higuchi | .................. | H01L 24/75 29/729 |
| 2011/0214286 A1 * | 9/2011 | Lee | ........................ | B23P 19/00 29/832 |
| 2012/0207574 A1 | 8/2012 | La Rovere et al. | | |

OTHER PUBLICATIONS

Extended European Search Report dated Sep. 16, 2016 in Patent Application No. 13895374.0.

* cited by examiner (a)

(b)

(b)

(a)

(a)

(b)

SUCTION NOZZLE AND COMPONENT MOUNTING MACHINE

TECHNICAL FIELD

The present disclosure relates to a suction nozzle and a component mounting machine which mount a component on an object in a state where a posture (orientation) of the component that is supplied from a component supply device is changed by 90° to a lateral orientation.

BACKGROUND ART

The component mounting machine in the related art is set so as to suck the component which is supplied from the component supply device (tray feeder, tape feeder, stick feeder, and the like) by the suction nozzle and mount on a circuit board or the like (refer to PTL 1).

CITATION LIST

Patent Literature

PTL 1: JP-A-2009-295946

SUMMARY

Problem to be Solved

The component mounting machine in the related art is set so as to mount the component which is sucked by the suction nozzle on the circuit board with the posture (orientation) without change, but according to the type of component, there are cases where the posture of the component on a commercially available tray which is acquired from a manufacturer or a vendor is 90° different from the posture in which the component is to be mounted. In such a case, an operator transfers the component on the commercially available tray to a dedicated tray, such that the orientation of the component is changed by 90°, and sets the dedicated tray in the component supply device. For this reason, there are defects that when the operator replenish the component, the operator needs to perform time consuming work such that the component on the commercially available tray is transferred to the dedicated tray, not only is component replenishment work troublesome, but it is also necessary to prepare the dedicated tray, and accordingly production costs are increased.

Here, PTL 1 discloses that in order to suck the component which is supplied by a stick feeder by the suction nozzle without changing an inclination posture on a chute, a nozzle section of the suction nozzle is configured so as to be able to be inclined so that the nozzle section is inclined according to an inclination angle of the component on the chute, and picks up by sucking the upper surface of the component with the inclined posture on the chute on the lower end of the nozzle section, then an orientation of the nozzle section goes back to a downward orientation, and the component which is sucked by the nozzle section is set to a downward posture and mounted on a circuit board. However, in this configuration, it is not possible to solve the problem described above because the component is mounted on the circuit board while the lower surface of the component in suction is oriented downwardly.

Means for Solving the Problem

In order to solve the problem described above, according to the present disclosure, there is provided a suction nozzle which is held on a mounting head of a component mounting machine that sucks and mounts a supplied component to an object, in which a nozzle section that sucks the component is swingably provided on a nozzle holder section which is held on the mounting head, and an orientation of the nozzle section is changed by 90° to a downward orientation or a lateral orientation by swinging the nozzle section, and the nozzle section sucks the component from above in a state in which the orientation of the nozzle section is the downward orientation in a component suction operation, and the component is mounted on the object in a state in which the orientation (posture) of the component that is sucked by the nozzle section is set to the lateral orientation by the nozzle section the orientation of which is changed by 90° to the lateral orientation by swinging the nozzle section in the component mounting operation.

When using the suction nozzle which is configured in this manner, since it is possible to mount the component on the object such as a circuit board and the like in the state in which the orientation (posture) of the component in suction is caused to be changed by 90° to the lateral orientation, even in a case where the posture of the component on a commercially available tray which is acquired from a manufacturer or a vendor is 90° different from the posture in which the component is to be mounted, it is not necessary to perform work in which an operator transfers the component on the commercially available tray to the dedicated tray, it is possible to use the commercially available tray without change, and component replenishment work is easy. Here, in a case where the posture of the component on the commercially available tray is the same as the posture in which the component is to be mounted, after the component is sucked, without changing the orientation of the nozzle section, the component may be mounted on the object such as a circuit board with the nozzle section remaining oriented downwardly.

The present disclosure may be set such that the nozzle section is engaged and held by engaging means in a state of being set in the downward orientation and in a state of being set in the lateral orientation respectively, but may be configured such that at least one magnet which holds the nozzle section by magnetic force in the state of being set in the downward orientation and in the state of being set in the lateral orientation respectively is provided. A configuration in which the downward and lateral states of the nozzle section are held using the magnet is advantageous in that the configuration is simple, deterioration over time such as wear and the like is slight, and durability is superior in comparison to a configuration of being held by the engaging means. Moreover, even if it is not possible to swing the nozzle section by 90° in an orientation change operation, since it is possible to bring the magnet closer to a magnetic member of a counterpart side by swinging the nozzle section, it is possible to attract the magnet to the magnetic member using magnetic attraction force of the magnet, and it is possible to reliably swing the nozzle section by 90°.

In addition, in a case where the downward and lateral states of the nozzle section are held by the magnet, the magnet may function as a stopper which limits a swingable range of the nozzle section to 90°. By doing this, it is possible to accurately hold the downward and lateral states of the nozzle section, and it is not necessary to provide a dedicated stopper.

The present disclosure may be configured to provide a driving source (motor, solenoid, and an actuator such as an air cylinder) which swings the nozzle section on the suction nozzle, but in this configuration, there is a disadvantage in that the configuration of the suction nozzle is complex.

Therefore, the present disclosure may be configured such that the orientation of the nozzle section is caused to be changed by 90° by moving the nozzle section horizontally or downwardly while contacting the nozzle section on a nozzle orientation change member which is provided in the component mounting machine when the orientation of the nozzle section is caused to be changed by 90°. In the component mounting machine, since a movement mechanism is provided which moves the suction nozzle in the XYZ direction (horizontal direction and up and down direction), it is possible to cause the orientation of the nozzle section to be changed by 90° by moving the nozzle section of the suction nozzle horizontally or downwardly while contacting the nozzle section on the nozzle orientation change member which is provided in the component mounting machine using the movement mechanism. Thereby, it is not necessary to provide the driving source which swings the nozzle section on the suction nozzle, and it is possible to simplify the configuration of the suction nozzle.

In this case, an elastically deformable buffer member may be provided on a portion of the nozzle section on which the nozzle orientation change member contacts. By doing this, it is possible to buffer a collision of the nozzle section and the nozzle orientation change member in the orientation change operation using the buffer member, and it is possible to suppress deterioration over time of the suction nozzle due to the orientation change operation.

In addition, the nozzle holder section may be configured so as to support the nozzle section to be movable up and down, and may have the biasing device which biases the nozzle section downwardly. By doing this, it is possible to absorb an impact force which acts on the nozzle section and the component using the biasing device in component suction or in mounting, and it is possible to prevent damage to the nozzle section and the component.

Here, in order to reliably mount the component which is sucked by the suction nozzle on the circuit board or the like, it is necessary to press down the component on the circuit board or the like, but since the suction nozzle of the present disclosure mounts the component on the circuit board or the like in a state in which the component is sucked by the nozzle section from the side, it is not possible to press down the component on the circuit board or the like from above at a leading end of the nozzle section, and it is necessary to press down the component on the circuit board or the like only by suction force of the nozzle section. For this reason, when the suction force of the nozzle section is weak, it is likely to unintentionally remove the component from the nozzle section in the component mounting operation, and the component mounting operation becomes unstable.

Therefore, there may be a configuration in which a plurality of nozzle sections are provided on the nozzle holder section, and one component is sucked using the plurality of nozzle sections. By doing this, since it is possible to stably suck one component using the plurality of nozzle sections, it is possible to increase the suction force with respect to one component, and it is possible to prevent the component from being unintentionally removed from the nozzle section in the component mounting operation, while it is also possible to increase force at which the component is pressed down on the circuit board or the like, and it is possible to stabilize the component mounting operation.

There is provided a component mounting machine which holds the suction nozzle of the present disclosure in the mounting head, including movement device that moves the nozzle orientation change member, in which when the orientation of the nozzle section may be caused to be changed by 90°, the nozzle orientation change member is moved by the movement device to a position where the nozzle orientation change member contacts on the nozzle section, and the mounting head moves the nozzle section horizontally or downwardly while the mounting head contacts the nozzle section on the nozzle orientation change member, and after the orientation change is completed, the nozzle orientation change member is retreated by the movement device to a position where the nozzle orientation change member does not interfere with the suction nozzle. By doing this, it is possible to reliably prevent the suction nozzle from interfering with the nozzle orientation change member during production after the orientation change of the nozzle section is completed.

In this case, the plurality of suction nozzles may be held on the mounting head of the component mounting machine, and the orientation of the nozzle sections of the plurality of suction nozzles may be caused to be changed by 90° by moving the nozzle sections of the plurality of suction nozzles horizontally or downwardly by the mounting head while the mounting head contacts the nozzle sections on the nozzle orientation changing member.

By doing this, it is possible to simultaneously perform the orientation change operation of the nozzle sections of the plurality of suction nozzles using one mounting head, and it is possible to efficiently perform the orientation change operation of the nozzle sections of the plurality of suction nozzles in time for changing orientation of a nozzle section having one suction nozzle.

In addition, the component mounting machine further includes a camera which images a component which is sucked by the nozzle section from below and image processing device which processes the image which is captured by the camera and recognizes the component, the orientation of the nozzle section is changed by 90° to the lateral orientation so that the component may be imaged by the camera from below in a state in which the orientation of the component which is sucked by the nozzle section is set in the lateral orientation, the amount of deviation in the horizontal direction of a component suction position of the nozzle section may be calculated by processing the image using the image processing device, and a command value of a mounting position of the component may be corrected according to the amount of deviation in the horizontal direction of the component suction position. By doing this, even if the component suction position of the nozzle section deviates, it is possible to precisely mount the component at a target mounting position by automatically correcting the command value of the mounting position of the component according to the amount of deviation of the component suction position.

In addition, component data in which dimension data of the component is included may be registered in a database, and the amount of lowering of the suction nozzle in the component suction operation and the amount of lowering of the suction nozzle in the component mounting operation may be calculated based on the dimension data of the component by acquiring the dimension data of the component sucked by the nozzle section from the database. By doing this, it is possible to automatically and precisely set the amount of lowering of the suction nozzle in the component suction operation and in the component mounting operation.

DESCRIPTION OF EMBODIMENTS

Figure 1:
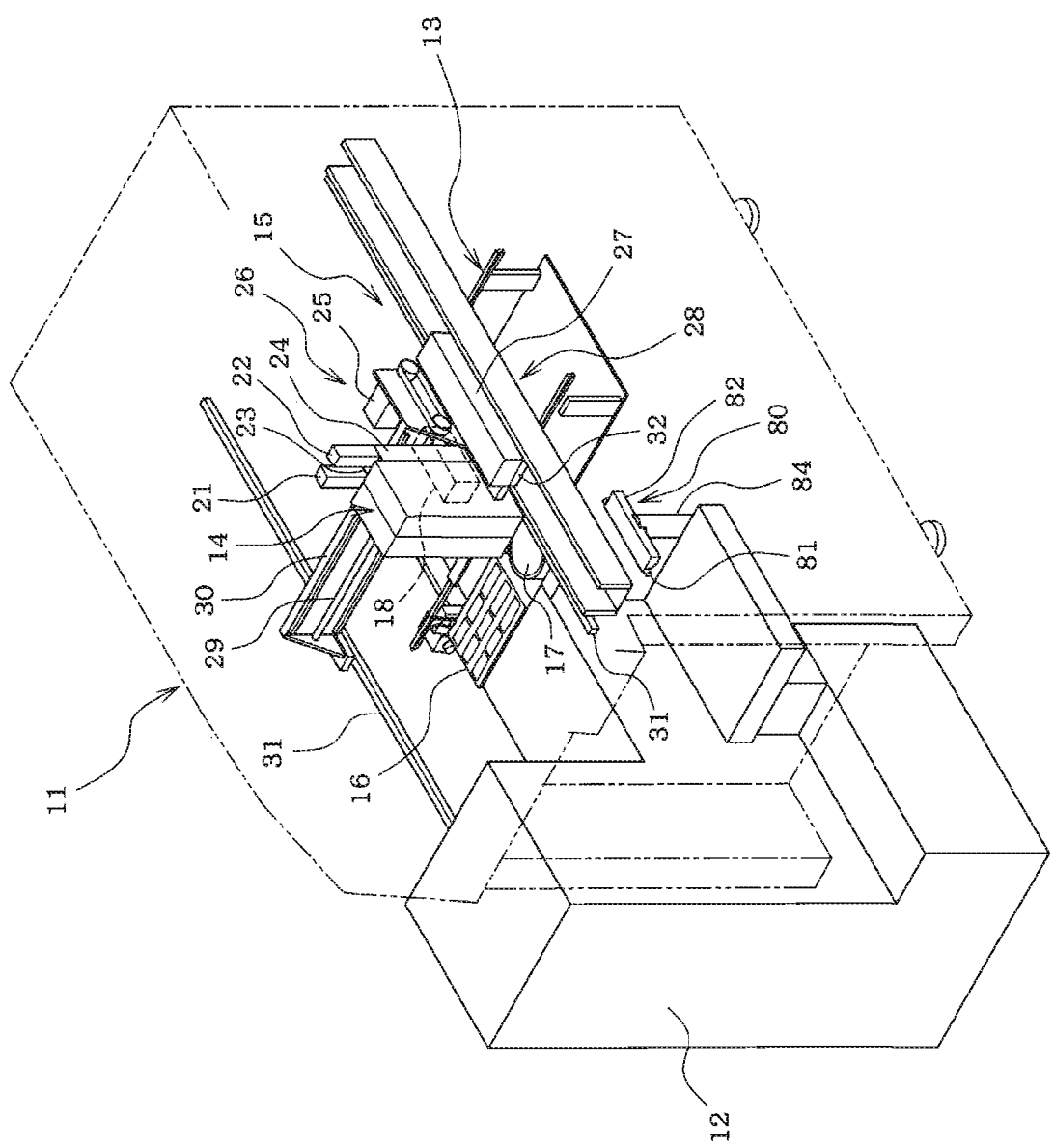
FIG. 1 is a perspective view of a component mounting machine illustrating an embodiment of the present invention.

An example specifying an embodiment of the present disclosure will be described below. First, the configuration of a component mounting machine 11 will be described based on FIG. 1.

A component supply device 12 which supplies a component is detachably set in the component mounting machine 11. The component supply device 12 which is set on the component mounting machine 11 may be any one of a tray feeder, tape feeder, bulk feeder, stick feeder, and the like, and of course, a plurality of types of feeders may be mixed. A conveyor 13 which transports a circuit board (not shown in the drawings), a mounting head 14 which mounts the component that is supplied from the component supply device 12 on the circuit board, an XY-axis moving mechanism 15 which moves the mounting head 14 in an XY axis direction (front, back, left, and right directions), a nozzle station 16 on which an suction nozzle 40 for replacement is located, and the like are provided in the component mounting machine 11.

The suction nozzle 40 which sucks a component which is supplied from the component supply device 12 is replaceably held on the mounting head 14. A component imaging camera 17 which captures the component that is held on the suction nozzle 40 from below is provided in the component mounting machine 11, and a mark imaging camera 18 which captures a reference position mark or the like of a circuit board is provided in the mounting head 14.

Figure 2:
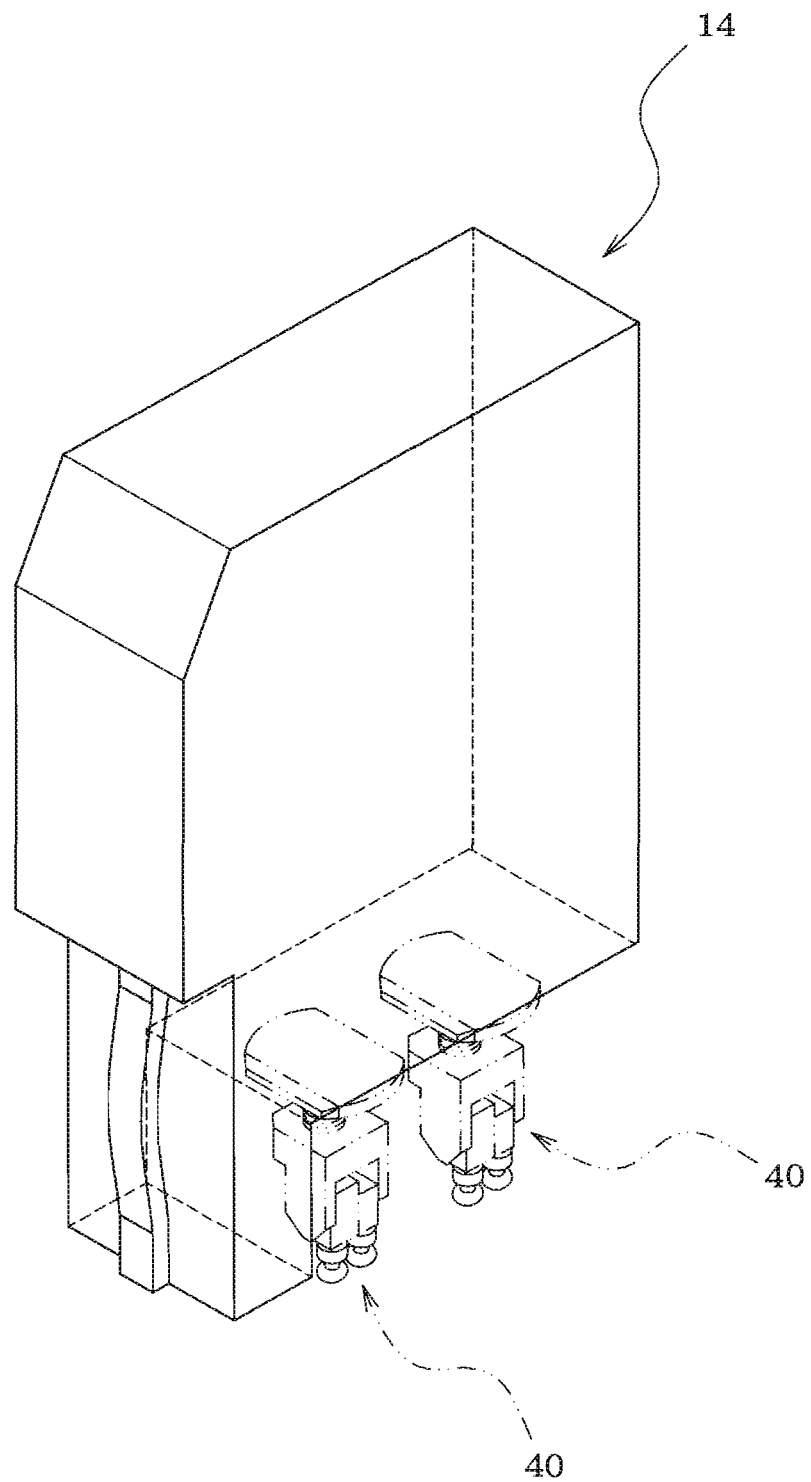
FIG. 2 is a perspective view of a mounting head.
Figure 3:
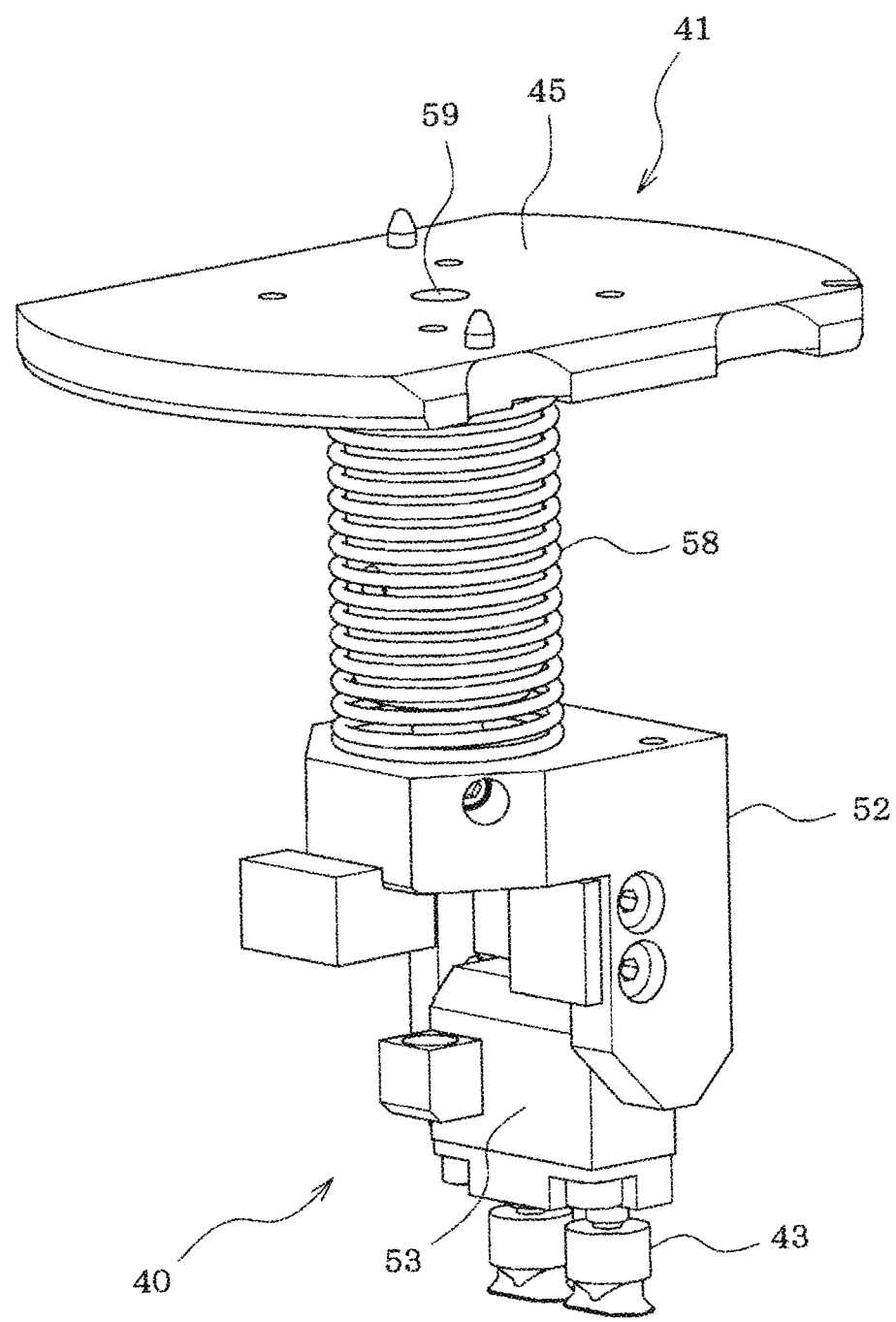
FIG. 3 is a perspective view that views a state in which nozzle sections of a suction nozzle are oriented downward from an oblique front surface side.

Two Z-axis slides 23 and 24 which are individually driven by two Z-axis motors 21 and 22 are provided on the mounting head 14, the suction nozzles 40 are detachably held respectively one by one on a lower side of each Z-axis slide 23 and 24 by negative pressure or the like (refer to FIG. 2), and each suction nozzle 40 moves up and down independently due to each Z-axis slide 23 and 24. Although not shown in the drawings, a Q shaft (rotary shaft) which rotates each suction nozzle 40 is assembled on each Z-axis slide 23 and 24.

The XY-axis moving mechanism 15 is configured from an X-axis slide mechanism 26 with an X-axis motor 25 including a servo motor and the like set as a driving source, and a Y-axis slide mechanism 28 with a Y-axis motor 27 including a linear motor and the like set as a driving source. The X-axis slide mechanism 26 rotates an X axis ball screw 29 using the X-axis motor 25, and moves an X-axis slide (not shown in the drawings) to which the mounting head 14 is attached in the X axis direction along an X-axis guide 30. The X-axis guide 30 is slidably supported on a Y-axis guide 31 of the Y-axis slide mechanism 28, and the X-axis guide 30 is connected to a Y-axis slide 32 to which the Y-axis motor 27 is attached. Thereby, the X-axis slide mechanism 26 moves in the Y axis direction along the Y-axis guide 31 by the Y-axis motor 27.

Next, a configuration of the suction nozzle 40 will be described using FIGS. 3 to 15. The suction nozzle 40 includes a nozzle holder section 41 which is held on the mounting head 14 and a nozzle section 43 which sucks the component, and the nozzle section 43 is swingably attached to the nozzle holder section 41 via a shaft pin 44 (refer to FIGS. 7, and 11 to 13).

Figure 7:
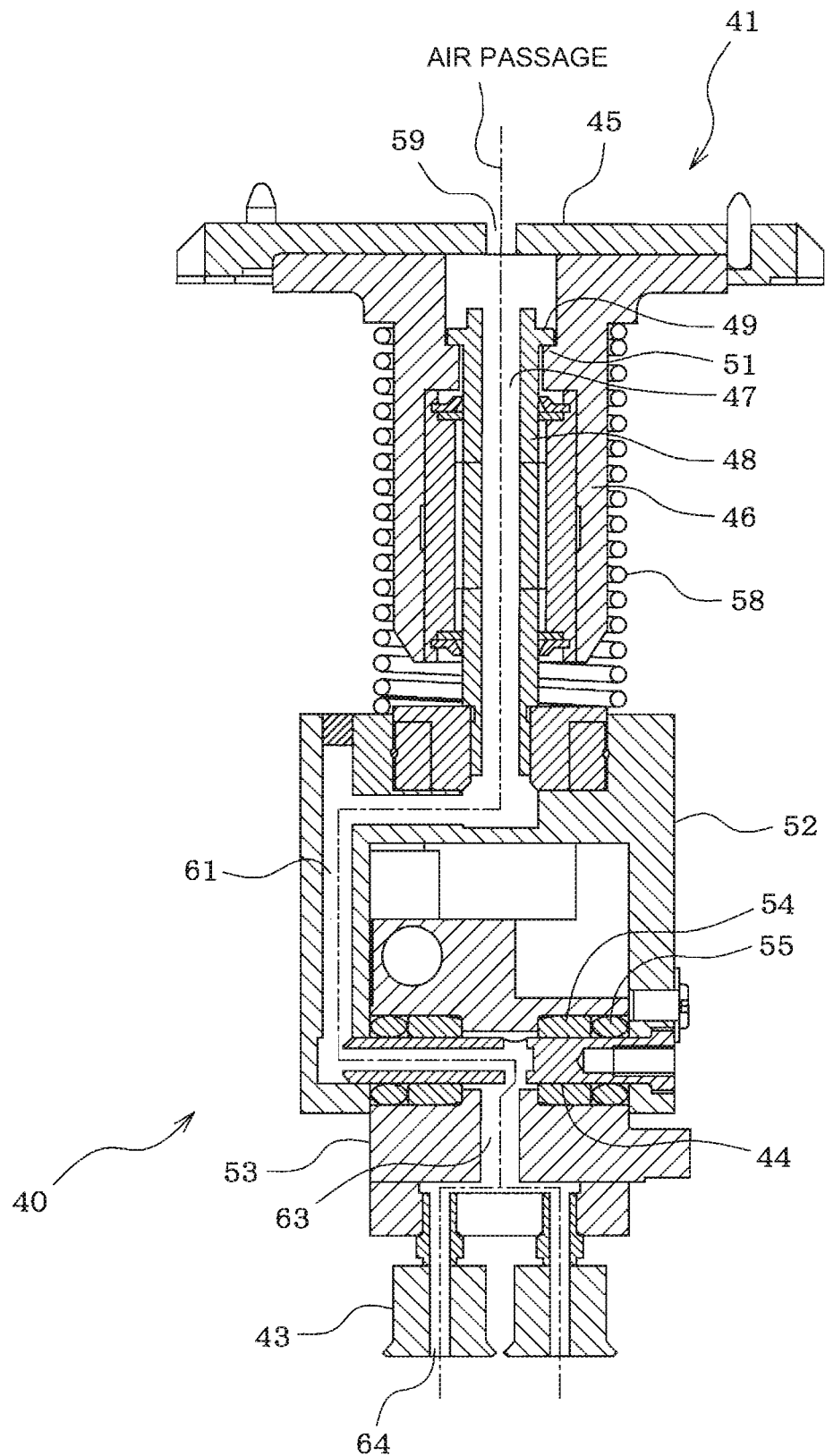
FIG. 7 is a right side sectional view illustrating a state in which the nozzle sections of the suction nozzle are oriented downwardly.
Figure 8:
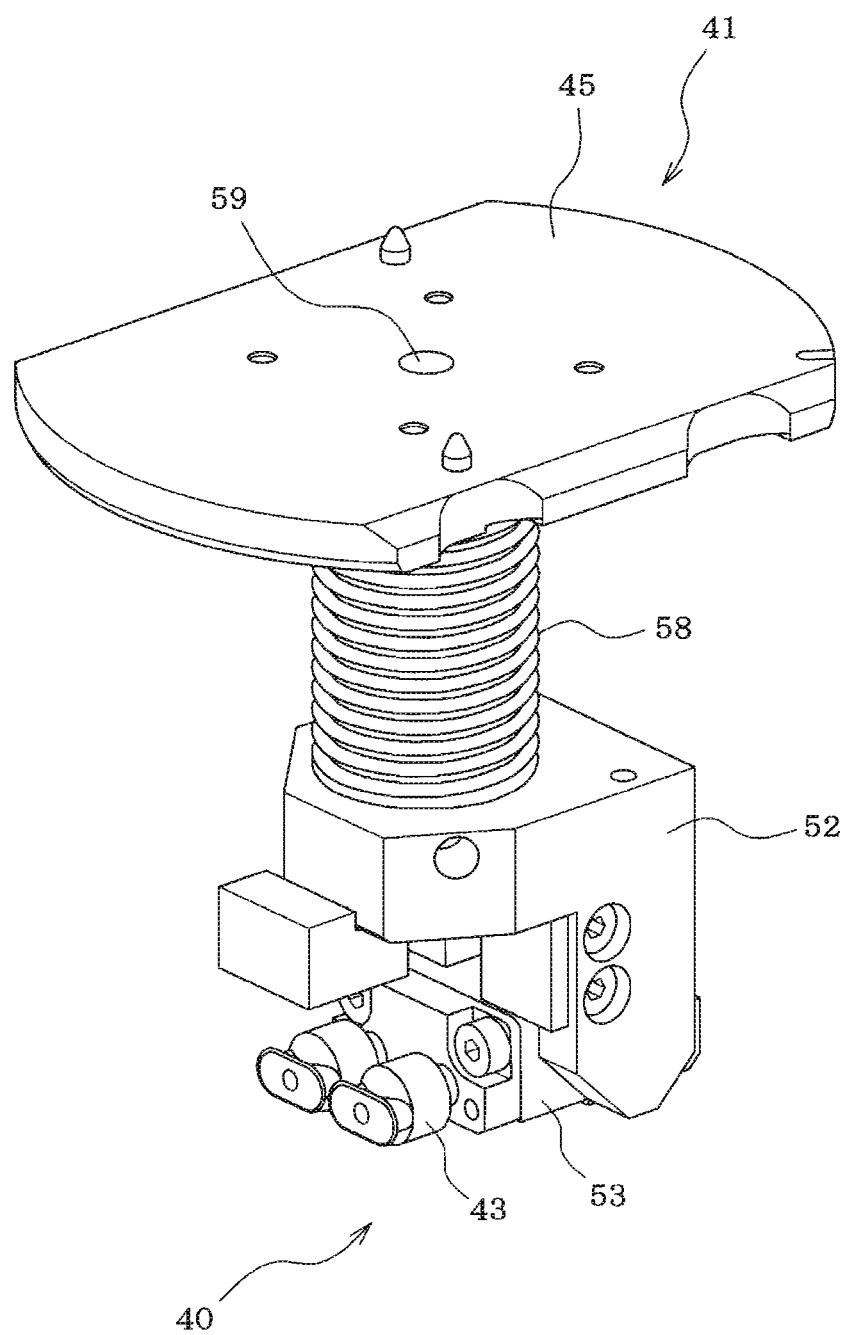
FIG. 8 is a perspective view that views a state in which the nozzle sections of the suction nozzle are oriented laterally from an oblique front surface side.
Figure 9:
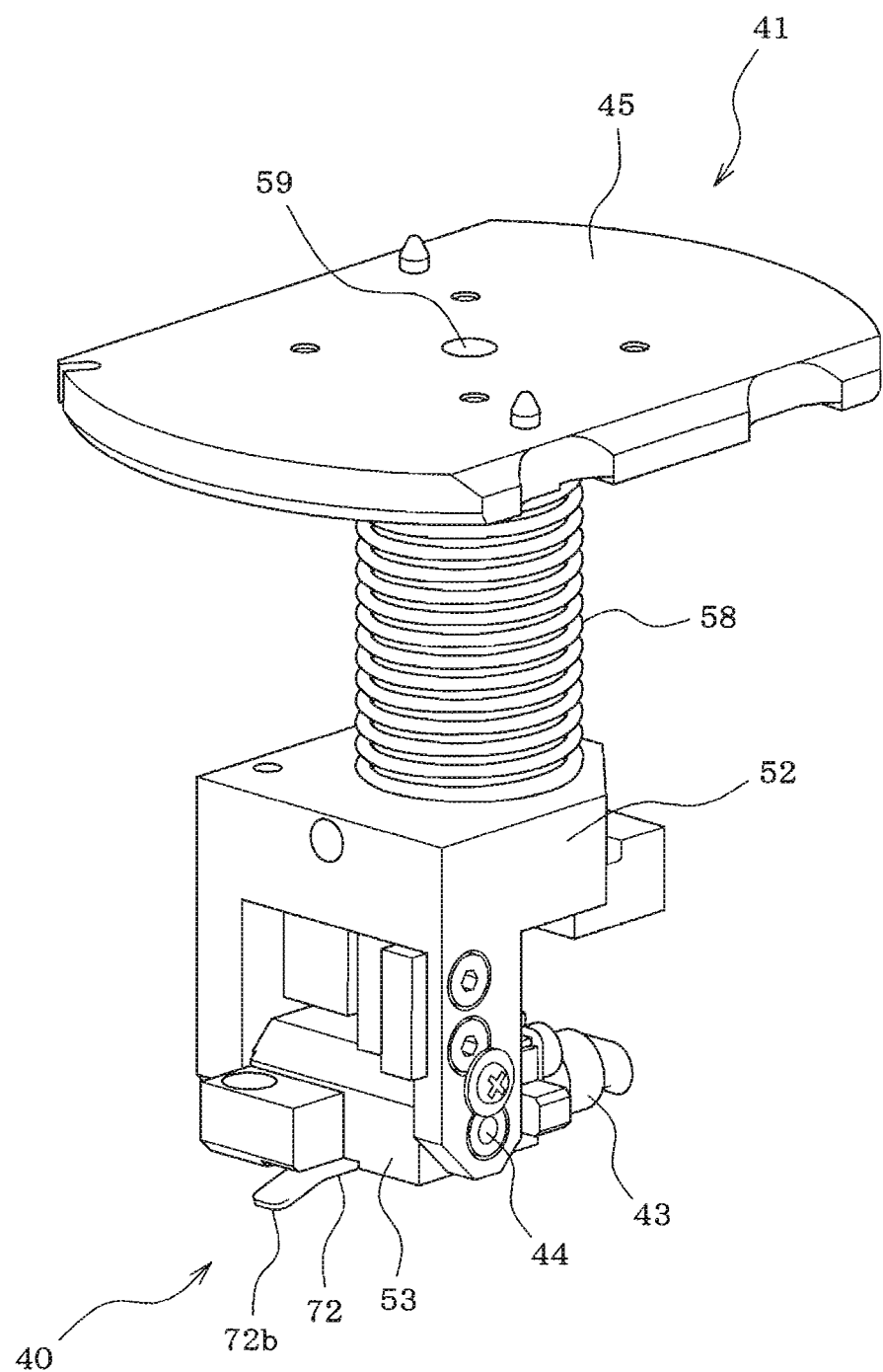
FIG. 9 is a perspective view that views a state in which the nozzle sections of the suction nozzle are oriented laterally from an oblique rear surface side.
Figure 10:
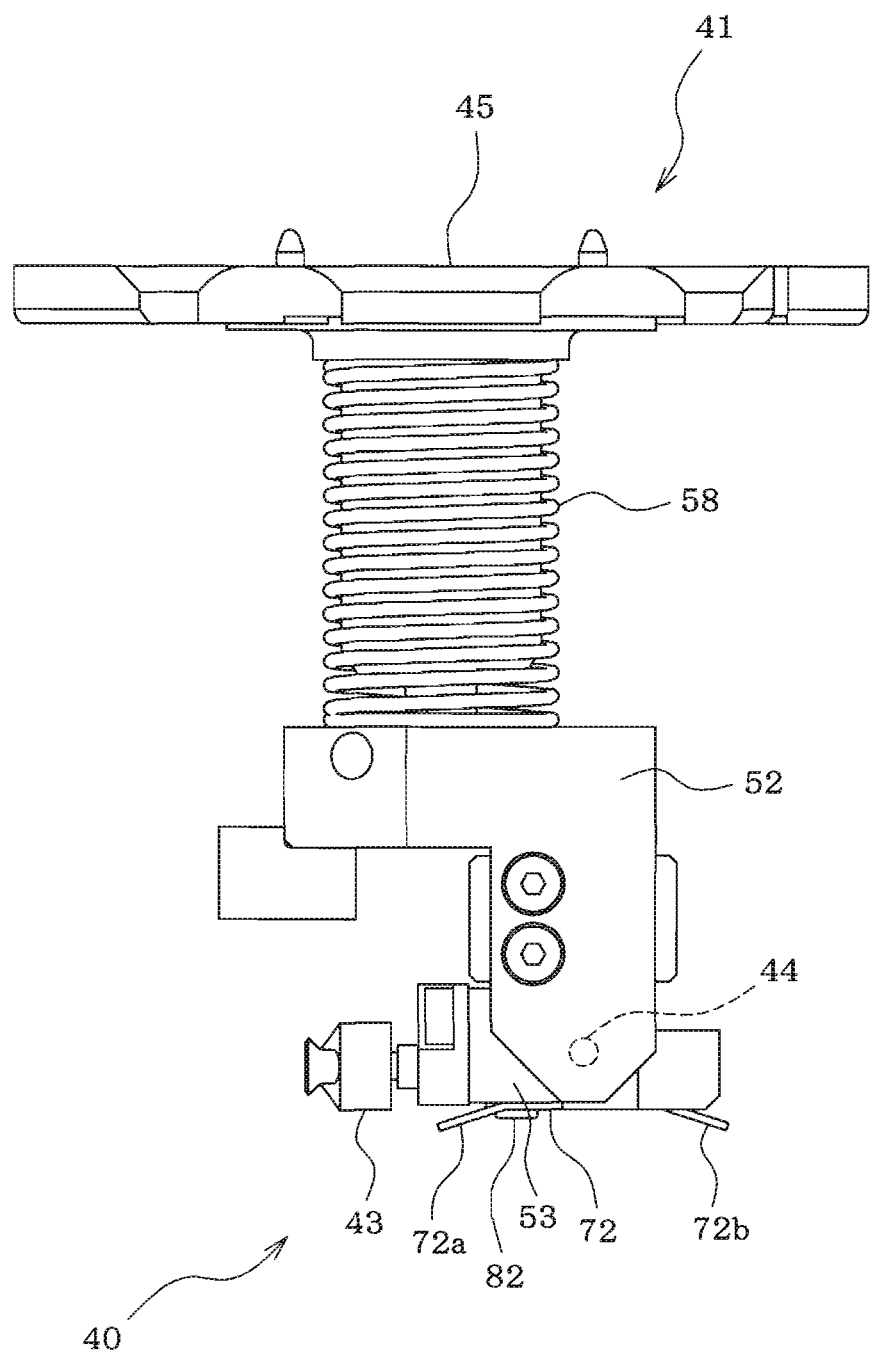
FIG. 10 is a front surface view illustrating a state in which the nozzle sections of the suction nozzle are oriented laterally.

A holding plate section 45 which is held on a lower end of the Q axis of the mounting head 14 due to negative pressure and the like is provided on an upper end of the nozzle holder section 41, as shown in FIG. 7, a cylindrical section 46 is provided on a lower surface side of the holding plate section 45, and a pipe section 48, which is configured by an air passage 47, spline-fits an inner diameter section of the cylindrical section 46 to be movable up and down. A stopper flange section 49 is formed on an upper section outer periphery of the pipe section 48, and a position at which the stopper flange section 49 abuts a step section 51 on an upper section inner peripheral side of the cylindrical section 46 is a lowermost position of the pipe section 48.

A lower section of the pipe section 48 protrudes downwardly from the cylindrical section 46, and a holding block 52 is fixed to a lower end of the pipe section 48. A swingable block 53 of the nozzle section 43 is swingably assembled on the holding block 52 via the shaft pin 44. A bush 54 and an O-ring 55 are inserted in the shaft pin 44, a gap between the shaft pin 44 and the swingable block 53 of the nozzle section 43 is sealed by the O-ring 55, and the swingable block 53 of the nozzle section 43 is swingably supported with respect to the shaft pin 44 by the bush 54. Thereby, the shaft pin 44 is set as a support point and the nozzle section 43 is supported so as to be able to change the orientation of the nozzle section by 90° to a downward orientation (vertically downward) or a lateral orientation (horizontal direction). In the present embodiment, two nozzle sections 43 are provided on the swingable block 53.

A spring 58 (biasing device) which biases the holding block 52 downwardly is mounted on the outer periphery of the cylindrical section 46, and the holding block 52 is usually held at the lowermost position (position at which the stopper section 49 of the pipe section 48 abuts the step section 51 of the cylindrical section 46) by a spring force of the spring 58, and the nozzle sections 43 which are held in the holding block 52 are held at the lowermost position.

As shown in FIG. 7, an air pressure introduction hole 59 is formed in a center section of the holding plate section 45 on the upper end of the suction nozzle 40, and the air pressure introduction hole 59 is linked to the air passage 47 inside the pipe section 48. An air passage 61 which links to the air passage 47 inside the pipe section 48 is formed on the holding block 52. An air passage 62 which links to the air passage 61 of the holding block 52 is formed in an axial center section of the shaft pin 44, and an opening section 62a which links the air passage 62 inside the shaft pin 44 to an air passage 63 of the swingable block 53 is formed in an intermediate section in the axial direction of the shaft pin 44. The air passage 63 of the swingable block 53 is linked to the air passages 64 inside the nozzle sections 43. Thereby, air pressure (negative pressure, positive pressure) which is supplied from the mounting head 14 is introduced into the air passages 47 and 61 to 63 inside the suction nozzle 40 through the air pressure introduction hole 59 of the suction nozzle 40, and is supplied to the air passages 64 inside the nozzle sections 43.

As shown in FIGS. 11(a) and 11(b), two magnets 68 and 69 are attached to the swingable block 53 of the nozzle sections 43 as means for holding the nozzle sections 43 in the downward and the lateral states, and corresponding thereto, magnetic members 70 and 71 of a ferrous material or the like to which each of magnets 68 and 69 is attracted are attached to the holding block 52 of the nozzle holder section 41. As shown in FIG. 11(a), the nozzle sections 43 are held in a downward state by one magnet 68 being attracted to one magnetic member 70 when the orientation of the nozzle sections 43 are downward, and as shown in FIG. 11(b), the nozzle sections 43 are held in the lateral state by the other magnet 69 being attracted to the other magnetic member 71 when the orientation of the nozzle sections 43 are lateral. Each magnet 68 and 69 and each magnetic member 70 and 71 also function as a stopper which limits the swingable range of the nozzle sections 43 to 90° from the downward orientation to the lateral orientation.

Figure 11:
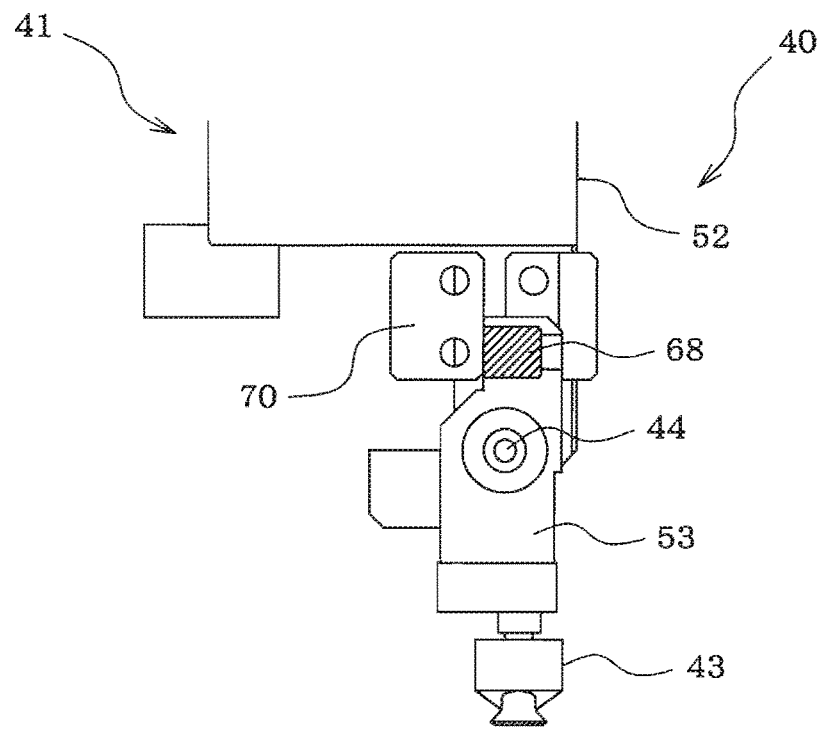
FIG. 11A is a front surface view illustrating a configuration in which the nozzle sections are held in a downward state.
FIG. 11B is a front surface view illustrating a configuration in which the nozzle sections are held in a lateral state.
Figure 11:
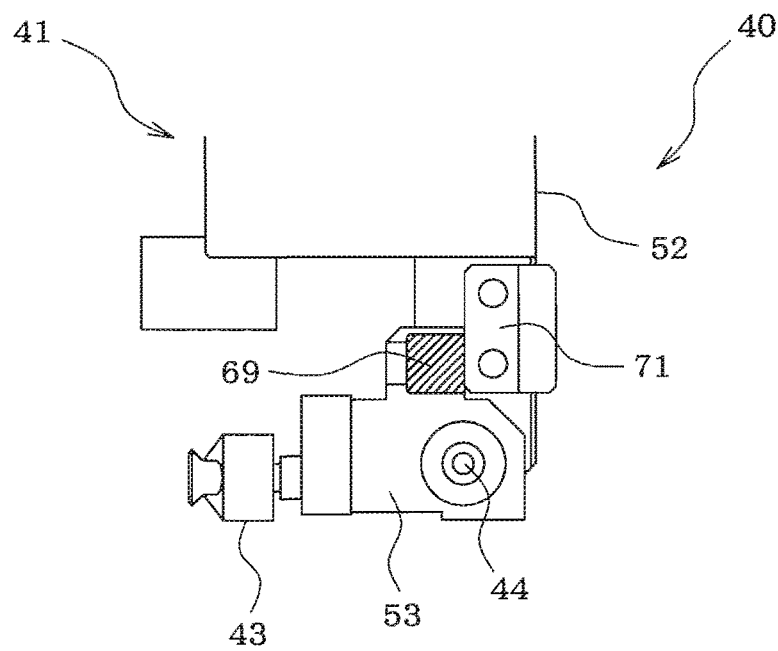

Here, in the configuration example in FIG. 11, the magnets 68 and 69 and the magnetic members 70 and 71 are respectively provided two by two, but there may be a configuration in which only one magnet is provided, and using one magnet, the nozzle sections 43 are held in the downward and lateral state. In addition, there may be a configuration in which attachment positions of the magnets and the magnetic members are opposite such that the magnets are provided on the holding block 52 of the nozzle holder section 41 and the magnetic members are provided to the swingable block 53 of the nozzle sections 43.

Figure 4:
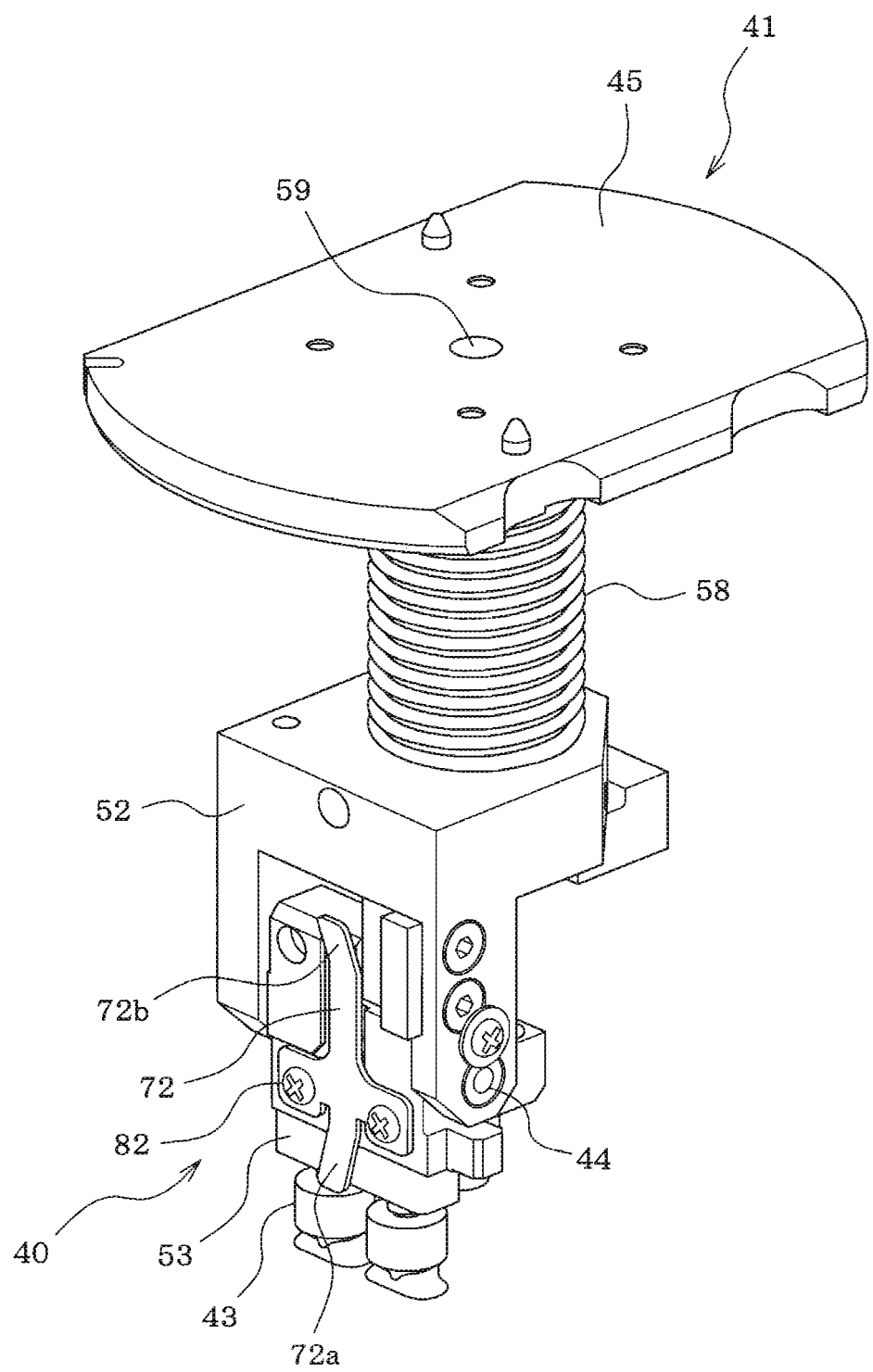
FIG. 4 is a perspective view that views a state in which the nozzle sections of the suction nozzle are oriented downward from an oblique rear surface side.
Figure 5:
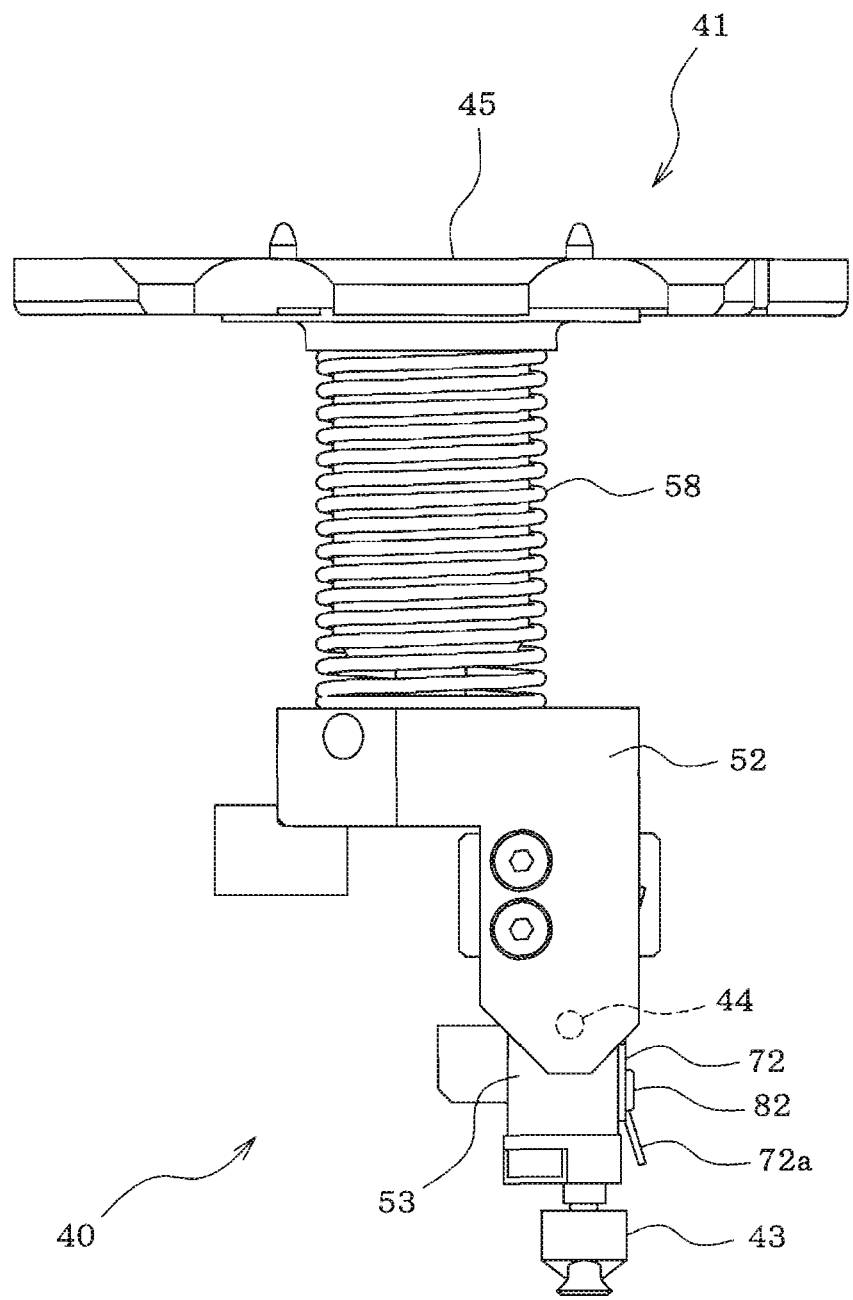
FIG. 5 is a front surface view illustrating a state in which the nozzle sections of the suction nozzle are oriented downwardly.
Figure 6:
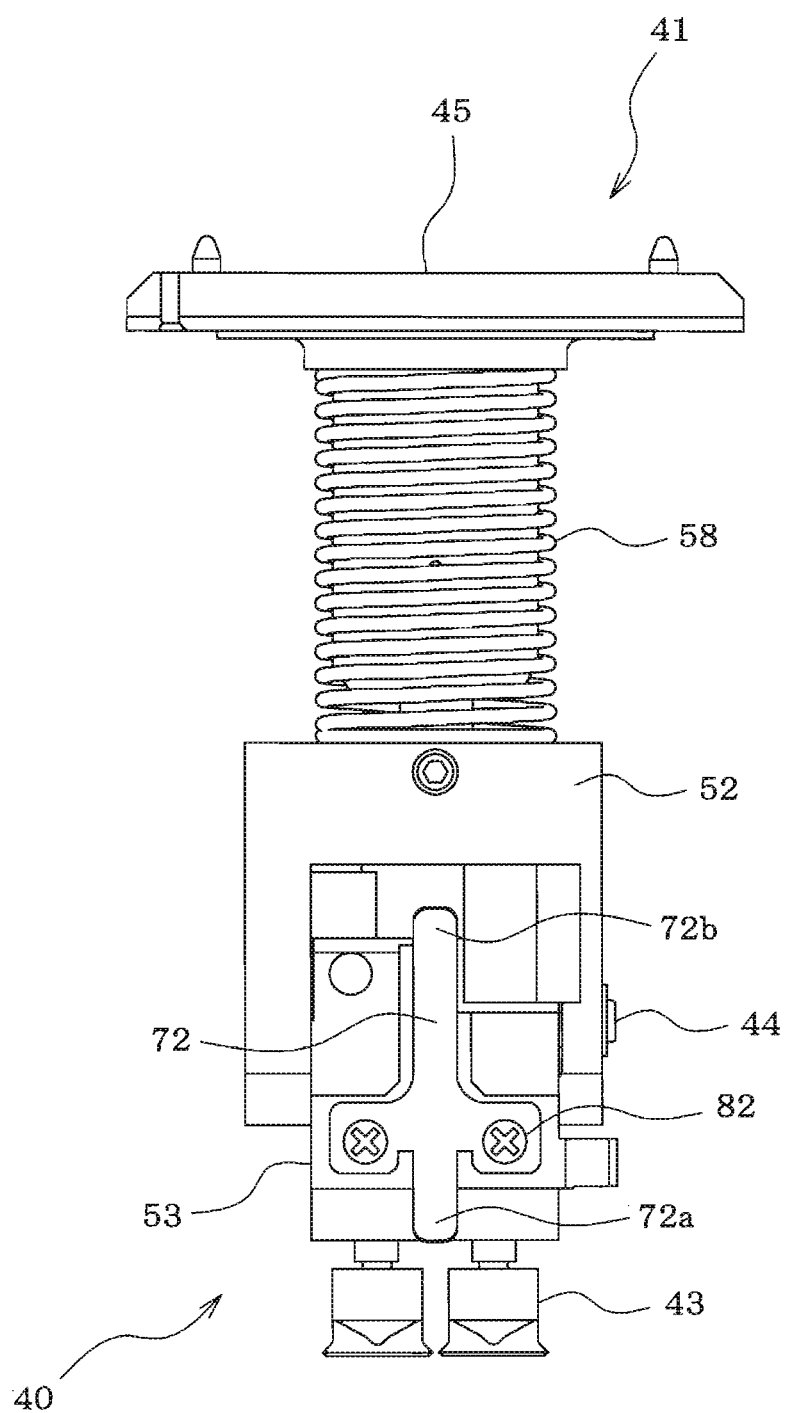
FIG. 6 is a right side surface view illustrating a state in which the nozzle sections of the suction nozzle are oriented downwardly.
Figure 12:
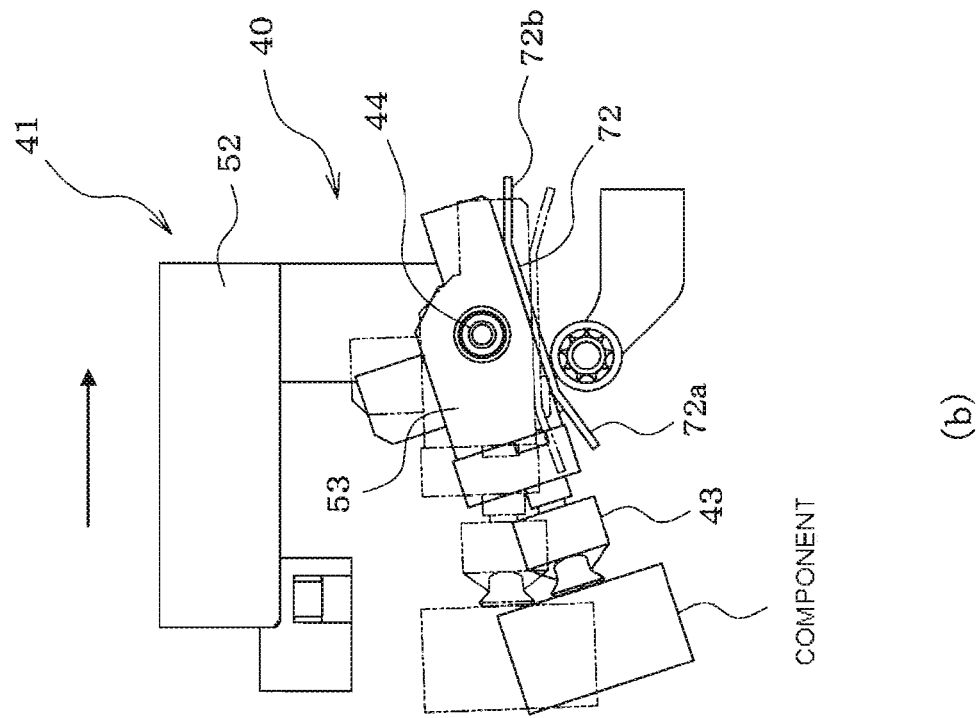
FIGS. 12A and 12B are front surface views that describe an operation in which the nozzle sections are caused to be changed by 90° from the downward orientation to the lateral orientation state.
Figure 12:
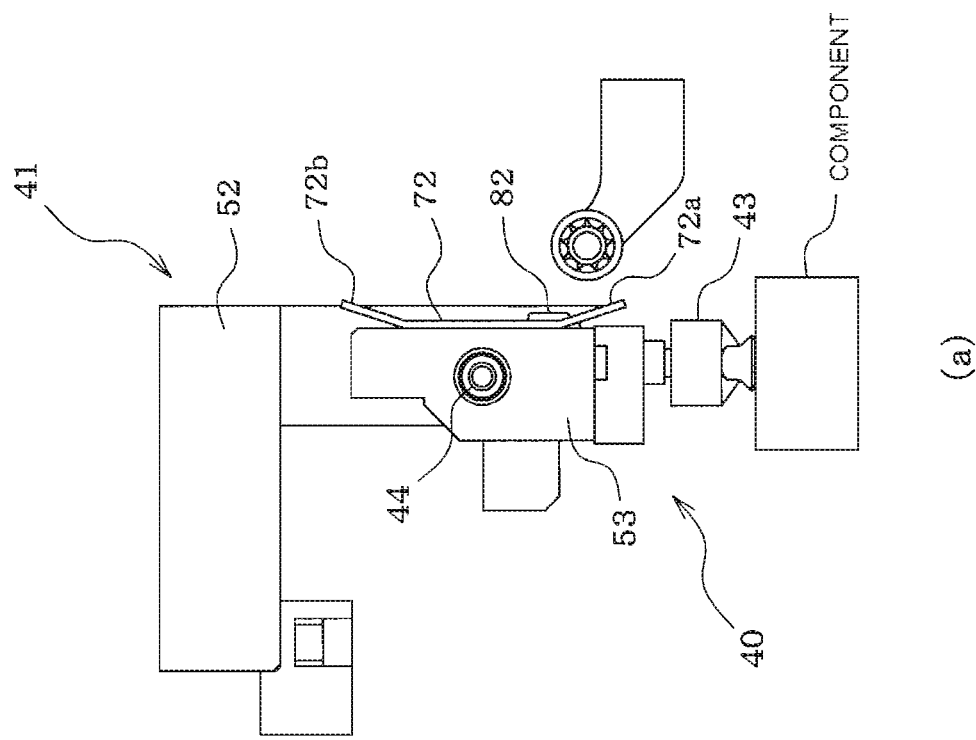
Figure 13:
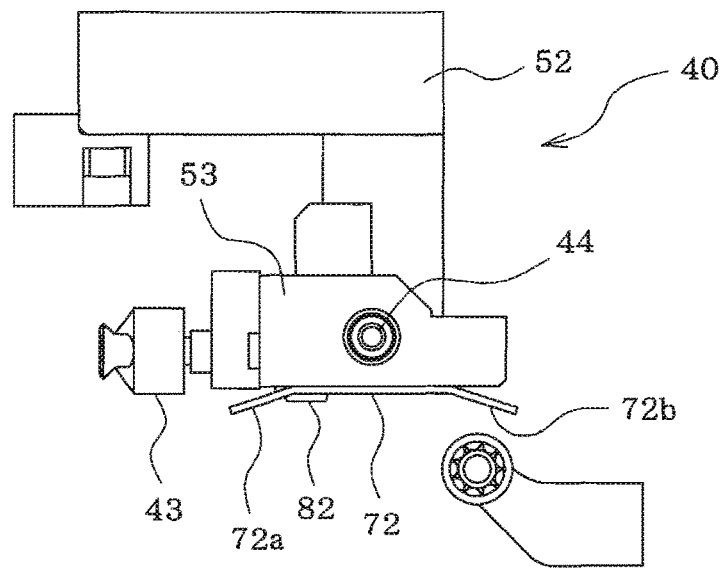
FIGS. 13A and 13B are front surface views that describe an operation in which the nozzle sections are caused to be changed by 90° from the lateral orientation to the downward orientation state.
Figure 13:
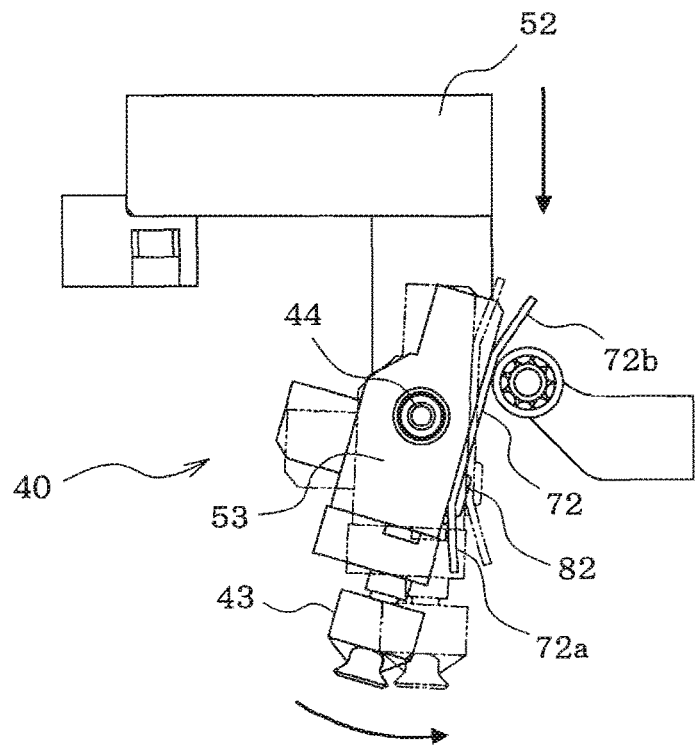

As shown in FIGS. 4, 12, and 13, an elastically deformable buffer member 72 is attached by a screw 73 and the like on a portion on which the nozzle orientation change member 81 which will be described later of the swingable block 53 of the nozzle sections 43 contacts (slides). The buffer member 72 is formed in a long and narrow plate form which extends in the axial direction of the nozzle section 43 using a plate spring and the like, and both end portions 72a and 72b are bent so as to be inclined in a direction which is separated from the nozzle section 43.

Figure 14:
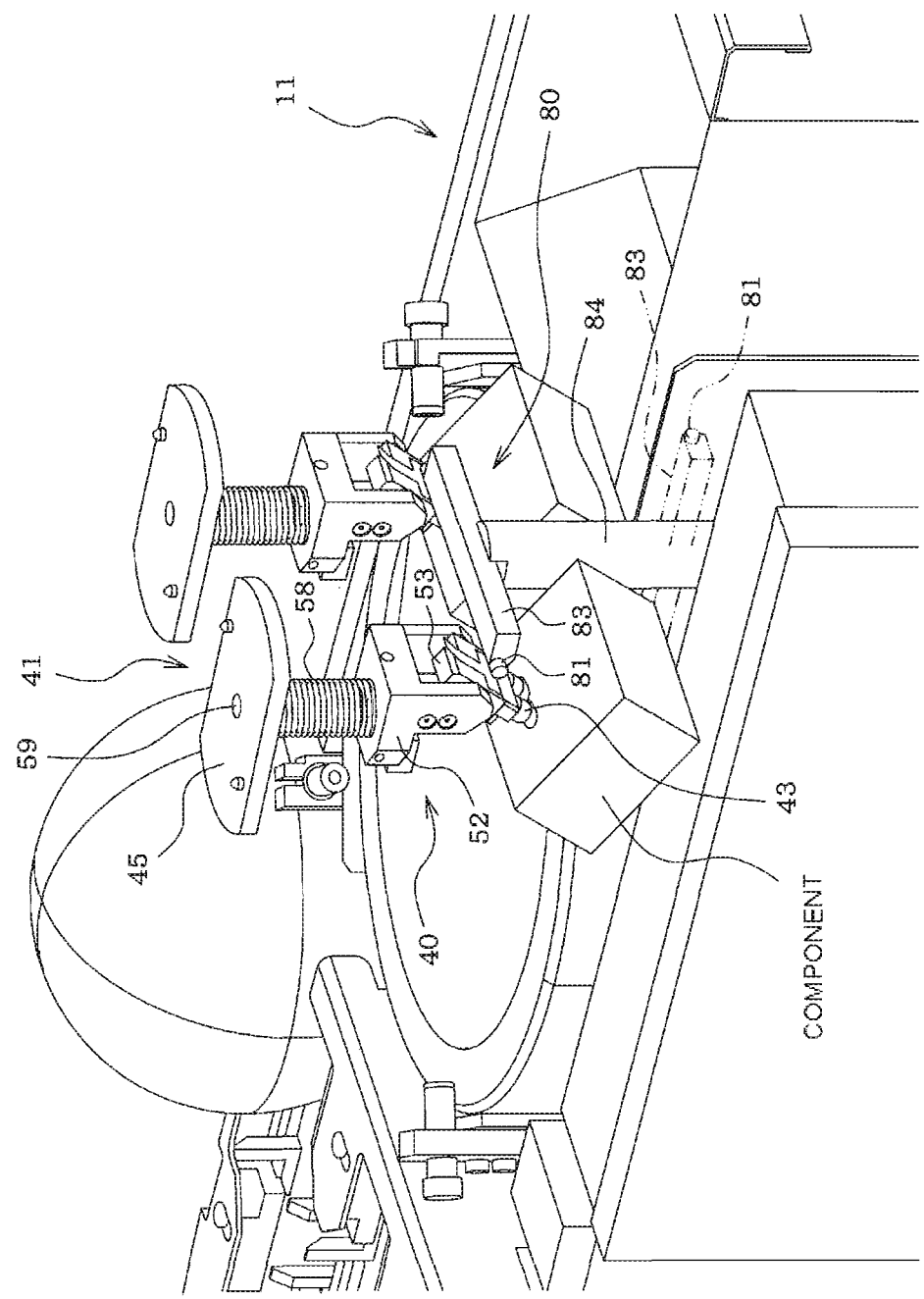
FIG. 14 is a perspective view illustrating a configuration of a nozzle orientation change unit, the suction nozzle, and a peripheral portion thereof.
Figure 15:
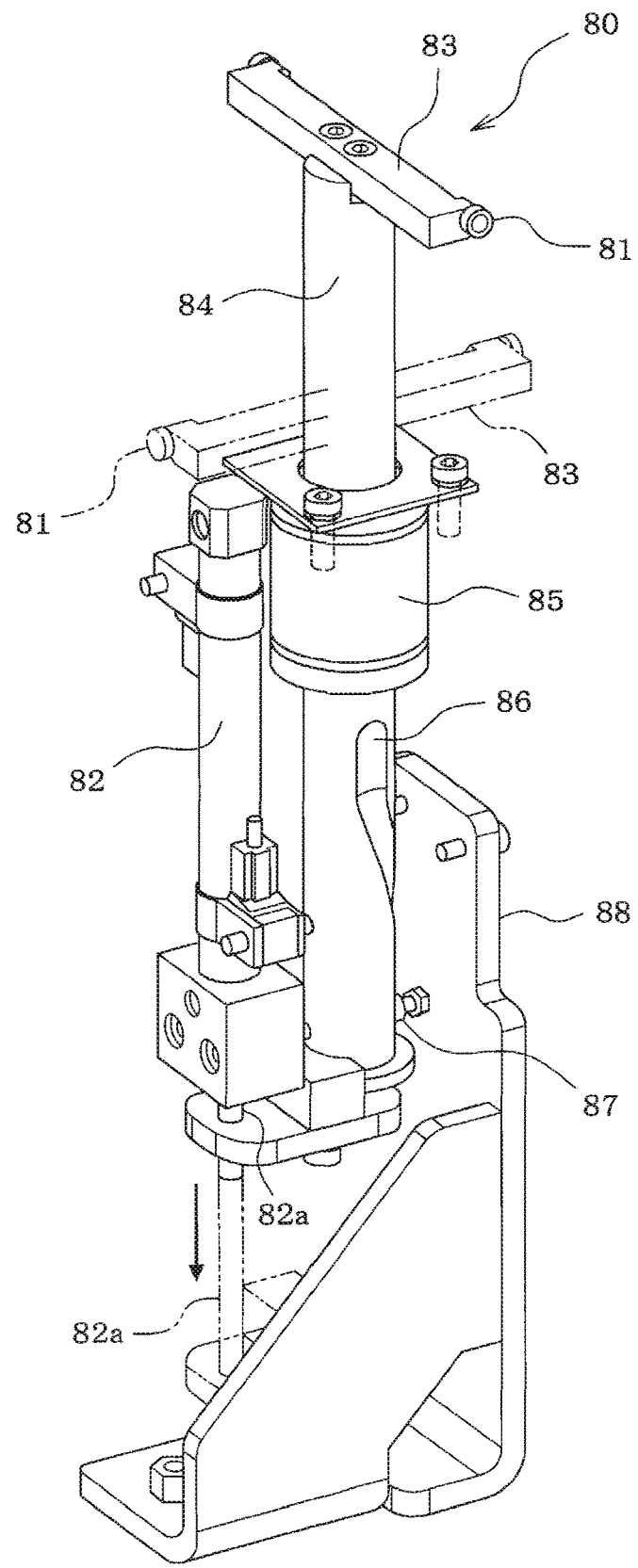
FIG. 15 is a perspective view illustrating a configuration of the nozzle orientation change unit.

Meanwhile, as shown in FIGS. 1 and 14, a nozzle orientation change unit 80 is provided in the component mounting machine 11 as means for changing the orientation of the nozzle sections 43 of the suction nozzle 40 by 90°. As shown in FIG. 15, the nozzle change unit 80 is a unit which moves the nozzle change member 81 up and down using an air cylinder 82 (movement device). The nozzle orientation change members 81 are configured by a member with small sliding resistance such as a bearing, and are attached horizontally to both ends of a horizontal support arm 83. A gap between two nozzle orientation change members 81 is set to be the same as a gap between the nozzle sections 43 of the two suction nozzles 40 which are held on the mounting head 14, and the orientations of the nozzle sections 43 of the two suction nozzles 40 are able to be simultaneously changed by 90° using the two nozzle orientation changing members 81.

A center section of the support arm 83 of the nozzle orientation change members 81 is fixed to the upper end of a lifting and lowering shaft 84 which extends in the up and down direction. The lifting and lowering shaft 84 is supported to be movable up and down and to be swingable by a guide bush 85, and the lower end of the lifting and lowering shaft 84 is connected to a rod 82a of the air cylinder 82 which is fixed downward. By this configuration, when the rod 82a of the air cylinder 82 is pulled up, the lifting and lowering shaft 84 is raised up to an uppermost position and the nozzle orientation change members 81 are raised up to a nozzle orientation changing operation position (uppermost position), and meanwhile, when the rod 82a of the air cylinder 82 protrudes downwardly, the lifting and lowering shaft 84 is lowered down to an lowermost position and the nozzle orientation change members 81 retreat to a retraction position (lowermost position).

When the nozzle orientation change member 81 is lowered from the nozzle orientation changing operation position to the retraction position, since the nozzle orientation change members 81 and the support arm 83 interfere with another configuring member within the component mounting machine 11 if the nozzle orientation change members 81 and the support arm 83 are lowered directly, interference with the other configuring members is avoided by turning the nozzle orientation change members 81 by a predetermined angle (for example, 90°). In order to perform the turning operation, a cam groove 86 is formed in the lifting and lowering shaft 84, and a cam follower 87 which fits the cam groove 86 is fixed to a unit attachment plate 88. Thereby, in a process in which the lifting and lowering shaft 84 is lowered from the uppermost position to the lowermost position, the support arm 83 of the nozzle orientation change members 81 is turned by a predetermined angle (for example, 90°) by swinging the lifting and lowering shaft 84 by a predetermined angle (for example, 90°).

Figure 16:
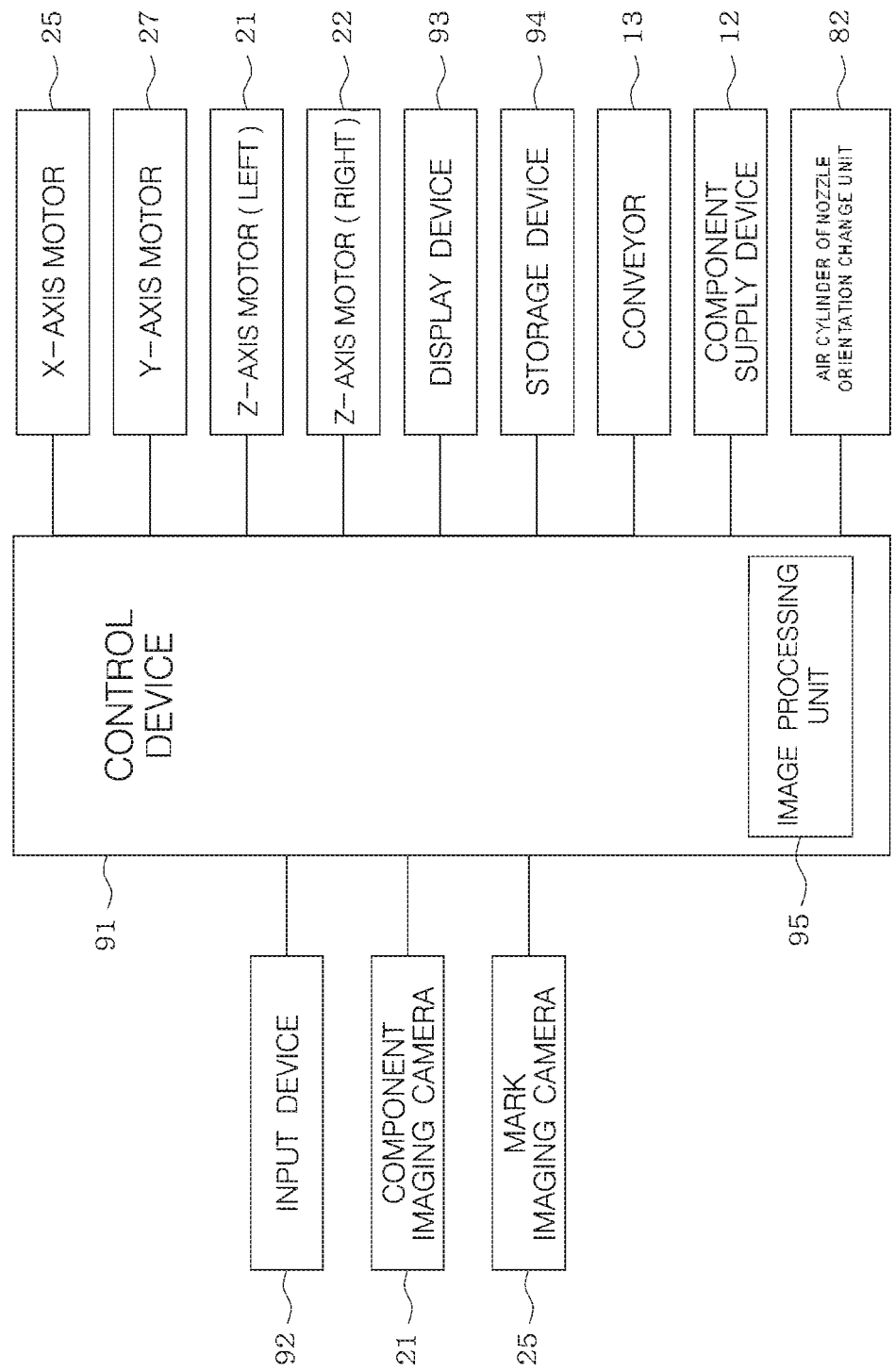
FIG. 16 is a block diagram illustrating a configuration of a control system of a component mounting machine.

As shown in FIG. 16, a control device 91 of the component mounting machine 11 is mainly configured of a computer, and an input device 92 such as a keyboard, mouse, or a touch panel, a display device 93 such as LCD, EL, or CRT, a storage device 94 which stores each type of control program or each type of data which control the component mounting machine 11, and the like are connected. Furthermore, an image processing unit 95 (image processing device) which processes an image that is captured by a component imaging camera 17 and a mark imaging camera 18 is built-in to the control device 91.

Component data in which dimension data of length, width, and height of a component that is sucked by the suction nozzle 40 of the component mounting machine 11 is included is stored in the storage device 94. A registration method of the component data may register the component data of various components in advance in a database of a production management computer (not shown in the drawings) which manages production of a component mounting line that includes the component mounting machine 11, and component data of the component which is designated using a production job by the production management computer may be read from the database and transferred to the storage device 94 of the component mounting machine 11.

The control device 91 of the component mounting machine 11 acquires the dimension data of the component which is sucked by the suction nozzle 40 from the database, the amount of lowering of the suction nozzle 40 in the component suction operation and the amount of lowering of the suction nozzle 40 in the component mounting operation are calculated based on the dimension data of the component, and controls a lowering operation of the suction nozzle 40 in the component suction operation and the component mounting operation.

Figure 17:
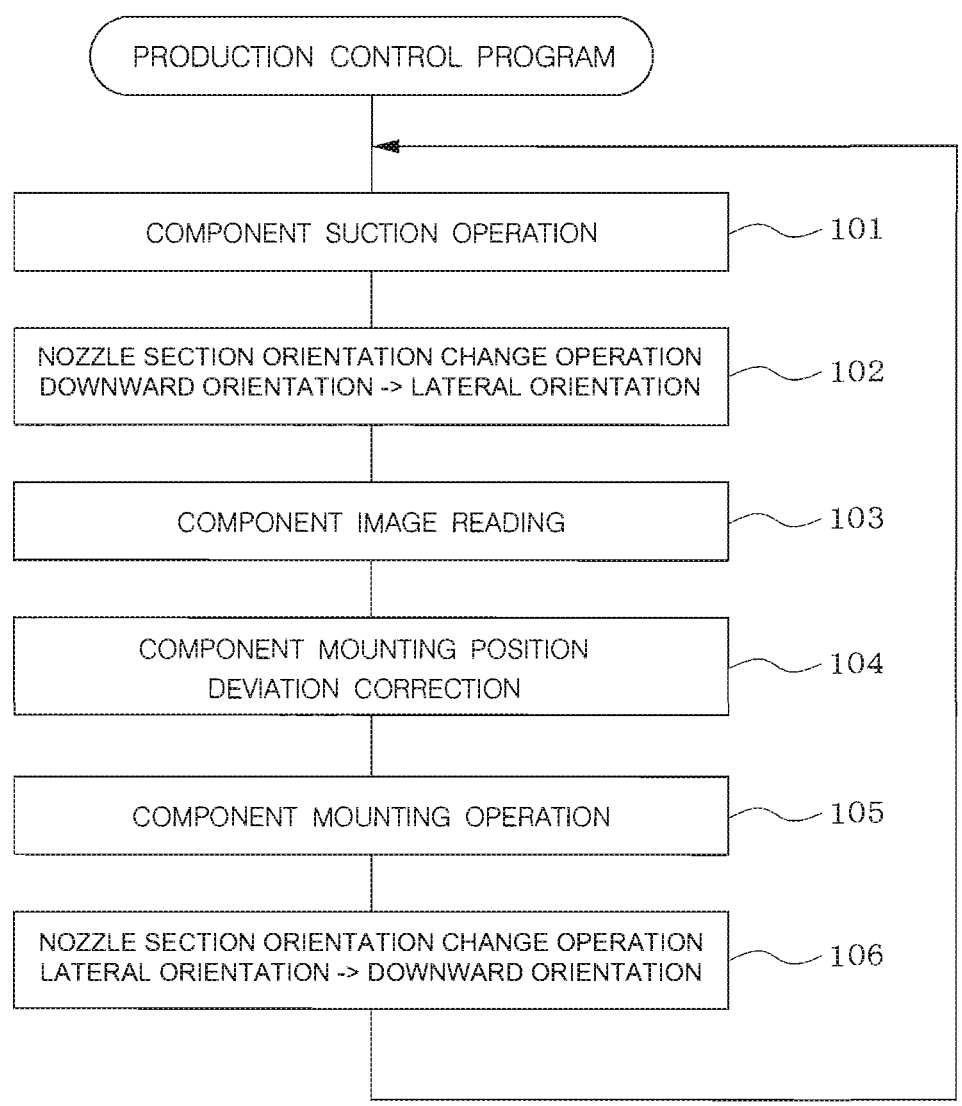
FIG. 17 is flow chart illustrating the flow of processes of a production control program.

The control device 91 controls the operation for sucking a component which is supplied from the component supply device 12 to the nozzle section 43 of the suction nozzle 40 and mounting on the circuit board according to the production control program in FIG. 17 during operation of the component mounting machine 11. Process content of the production control program in FIG. 17 will be described below.

First, in step 101, the suction nozzle 40 is lowered above the component which is supplied from the component supply device 12 while the orientation of the nozzle sections 43 of the suction nozzle 40 is held in the downward state, and the nozzle sections 43 suck a component with a horizontal posture, then the suction nozzle 40 is raised. At this time, the amount of lowering of the suction nozzle 40 is set based on the dimension data of the component which is acquired from the database.

After this, the process proceeds to step 102, and as follows, the orientation of the nozzle sections 43 of the suction nozzle 40 is changed by 90° from a downward orientation to a lateral orientation, and the orientation of the component which is sucked by the nozzle sections 43 is switched to a lateral orientation.

First, the air cylinder 82 of the nozzle orientation change unit 80 is operated, the nozzle orientation change members 81 are raised to the nozzle orientation changing operation position (uppermost position) by the lifting and lowering shaft 84 raised to the uppermost position, and the suction nozzle 40 is moved above the nozzle orientation change unit 80, and as shown in FIG. 12(*a*), a lower portion of the buffer member 72 of the nozzle sections 43 of the suction nozzle 40 than the shaft pin 44 comes to be in a state close to the side of the nozzle orientation change member 81. In this state, the suction nozzle 40 is horizontally moved to the nozzle orientation change member 81 side and the lower section of the buffer member 72 of the nozzle sections 43 contacts the nozzle orientation change member 81, and then, as shown in FIG. 12(*b*), the horizontal movement of the suction nozzle 40 continues for some time. Thereby, a lower portion of the nozzle sections 43 than the shaft pin 44 is pressed against the nozzle orientation change member 81, the nozzle sections 43 swings 90° in the clockwise direction in FIG. 12 using the shaft pin 44 as a support point, and the orientation of the nozzle sections 43 is in the lateral state, and as shown in FIG. 11(*b*), the nozzle sections 43 are held in the lateral state by the magnet 69 of the nozzle sections 43 being attracted and abutting the magnetic member 71 of the holding block 52 of the nozzle holder section 41. By doing this, the horizontal movement of the suction nozzle 40 is stopped at a time point at which the orientation of the nozzle sections 43 is changed by 90° from the downward orientation to the lateral orientation.

In the orientation change operation of the nozzle sections 43, when the orientation of the nozzle sections 43 comes close to the lateral orientation, an inclination portion 72*a* of the buffer member 72 is pressed against the nozzle orientation change member 81, the inclination portion 72*a* is elastically deformed, and the nozzle sections 43 are reliably swung up to the lateral state (state in which the magnet 69 contacts and is attracted to the magnetic member 71).

In this case, in consideration of manufacturing tolerances, positional alignment error in operation, and the like, it is desirable to set the gap in the up and down direction between the shaft pin 44 of the nozzle sections 43 and the nozzle orientation change member 81 to a dimension slightly larger than the total thickness of the swingable block 53 and buffer member 72 of the nozzle sections 43 between the shaft pin 44 and the nozzle direction change member 81. By doing this, it is possible to swing the nozzle sections 43 until the magnet 69 contacts the magnetic member 71 by pressing the inclination portion 72*a* of the buffer member 72 against the nozzle orientation change member 81 by the horizontal movement of the suction nozzle 40. In addition, by some possibility, even if it is not possible to swing the nozzle sections 43 using the nozzle orientation change member 81 to the extent that the magnet 69 contacts the magnetic member 71, since it is possible for the magnet 69 to come close to the magnetic member 71 by the swing of the nozzle sections 43 up to that point, it is possible to attract the magnet 69 to the magnetic member 71 by magnetic attraction force of the magnet 69, and it is possible to swing the nozzle sections 43 in the lateral state.

In addition, since the nozzle sections 43 are supported to be movable up and down in a state of being biased downwardly by the spring force of the spring 58 with respect to the nozzle holder section 41, even in a case in which a gap in the up and down direction between the shaft pin 44 of the nozzle sections 43 and nozzle orientation change member 81 is smaller than a total thickness dimension of the swingable block 53 and the buffer member 72 thereof, the nozzle sections 43 are swung up to the lateral state while the nozzle sections 43 are pushed up opposing spring force of the spring 58 on the nozzle holder section 41 side by the nozzle orientation change member 81 due to the horizontal movement of the suction nozzle 40.

As described above, the horizontal movement of the suction nozzle 40 is stopped at a time point at which the orientation of the nozzle sections 43 is caused to be changed by 90° from a downward orientation to a lateral orientation, and the air cylinder 82 of the nozzle orientation change unit 80 is operated, and the nozzle orientation change member 81 is retreated to the retraction position (lowermost position) by lowering the lifting and lowering shaft 84 to the lowermost position. At this time, the nozzle orientation change member 81 and the support arm 83 avoid interference with the other configuring members of the component mounting machine 11 by swinging the lifting and lowering shaft 84 by a predetermined angle (for example, 90°) using the cam groove 86 of the lifting and lowering shaft 84.

After this, the process advances to step 103, the component of the lateral posture which is sucked by the nozzle sections 43 of the suction nozzle 40 is imaged from below by moving the suction nozzle 40 to a capturing position above the component imaging camera 17, and the amount of deviation in the horizontal direction of the suction position of the component is calculated with respect to the nozzle sections 43 by recognizing the component by processing the image using the image processing unit 95. After this, the process advances to step 104, a command value of the component mounting position is corrected according to the amount of deviation in the horizontal direction of the suction position of the component with respect to the nozzle sections 43, and in the subsequent step 105, the suction nozzle 40 moves above the component mounting position of the circuit board, the suction nozzle 40 is lowered, and the component of the lateral posture which is sucked by the nozzle sections 43 is mounted at the component mounting position of the circuit board. At this time, the amount of lowering of the suction nozzle 40 is set based on the dimension data of the component which is acquired from the database.

In the component mounting operation, in order that the component is reliably mounted on the circuit board, the suction nozzle 40 is lowered to a height position at which the component of the lateral posture that is sucked by the nozzle sections 43 is lightly pressed on the circuit board, and since the nozzle sections 43 are supported to be movable up and down in a state of being biased downward by the spring force of the spring 58 with respect to the nozzle holder section 41, after the component of the lateral posture which is sucked by the nozzle sections 43 contacts the circuit board, deviation of the height position of the component of the lateral posture in the component mounting operation which occurs due to the deviation in the horizontal direction of the suction position of the component of the horizontal posture in the component suction operation is absorbed by the nozzle sections 43 being pushed up opposing spring force of the spring 58 by the lowering of the suction nozzle 40. After the component mounting operation is complete, the suction nozzle 40 is raised.

After this, the process proceeds to step 106, and as follows, the orientation of the nozzle sections 43 of the suction nozzle 40 is changed by 90° from a lateral orientation to a downward orientation. First, the air cylinder 82 of the nozzle orientation change unit 80 is operated, the nozzle orientation change member 81 is raised to the nozzle orientation changing operation position (uppermost position) by the lifting and lowering shaft 84 raised to the uppermost position, and the suction nozzle 40 is moved above the nozzle orientation change unit 80, and as shown in FIG. 13(a), a portion of the buffer member 72 of the nozzle sections 43 of the suction nozzle 40 more on the right side than the shaft pin 44 comes to be in a state close above the nozzle orientation change member 81. In this state, after the suction nozzle 40 is lowered and the buffer member 72 of the nozzle sections 43 is contacted on the nozzle orientation change member 81, as shown in FIG. 13(b), the lowering operation of the suction nozzle 40 continues for some time. Thereby, the portion of the nozzle section 43 more on the right side than the shaft pin 44 is pressed up against the nozzle orientation change member 81, the nozzle sections 43 swings 90° in the counterclockwise direction using the shaft pin 44 as a support point in FIG. 13, and the orientation of the nozzle sections 43 is in the downward state, and as shown in FIG. 11(a), the nozzle sections 43 are held in the downward state by the magnet 68 of the nozzle sections 43 being attracted and abutting the magnetic member 70 of the holding block 52 of the nozzle holder section 41. By doing this, the lowering operation of the suction nozzle 40 is stopped at the time point at which the orientation of the nozzle sections 43 is caused to be changed by 90° from a lateral orientation to a downward orientation.

In the orientation change operation of the nozzle sections 43, by lowering the suction nozzle 40, an inclination portion 72b of the buffer member 72 is pressed against the nozzle orientation change member 81, the inclination portion 72b is elastically deformed, and the nozzle sections 43 are reliably swung up to the downward state (state in which the magnet 68 contacts and is attracted to the magnetic member 70).

In this case, in consideration of manufacturing tolerances, positional alignment error in operation, and the like, it is desirable to set the gap in the horizontal direction between the shaft pin 44 of the nozzle sections 43 and the nozzle orientation change member 81 to a dimension slightly larger than the total thickness of the swingable block 53 and buffer member 72 of the nozzle sections 43 between the shaft pin 44 and the nozzle orientation change member 81. By doing this, it is possible to swing the nozzle sections 43 until the magnet 68 contacts the magnetic member 70 by contacting the inclination portion 72b of the buffer member 72 on the nozzle orientation change member 81 by the lowering operation of the suction nozzle 40. In addition, by some possibility, even if it is not possible to swing the nozzle section 43 using the nozzle orientation change member 81 to the extent that the magnet 68 contacts the magnetic member 70, since it is possible for the magnet 68 to come close to the magnetic member 70 by the swing of the nozzle sections 43 up to that point, the magnet 68 is attracted to the magnetic member 70 by magnetic attraction force of the magnet 68, and the nozzle sections 43 is held in the downward state.

As described above, the lowering movement of the suction nozzle 40 is stopped at a time point at which the orientation of the nozzle sections 43 is caused to be changed by 90° from the lateral orientation to the downward orientation, and the air cylinder 82 of the nozzle orientation change unit 80 is operated, and the nozzle orientation change member 81 is retreated to the retraction position (lowermost position) by lowering the lifting and lowering shaft 84 to the lowermost position. Thereafter, the component mounting board is produced by repeating each operation of steps 101 to 106.

Here, there is a possibility that the orientation of the nozzle sections 43 is lateral at production start, but at production start, the orientation of the nozzle sections 43 of the suction nozzle 40 is unknown. In a case where the orientation of the nozzle sections 43 is lateral at production start, it is necessary to perform the component suction operation after returning the orientation of the nozzle sections 43 to the downward orientation.

Therefore, in the present embodiment, at production start, the component suction operation is performed after returning the orientation of the nozzle sections 43 to the downward orientation by executing the operation in the same manner as the nozzle orientation changing operation which is executed in step 106 described above. At this time, in a case where the orientation of the nozzle sections 43 is already the downward orientation at production start, even if the suction nozzle 40 is lowered in the nozzle orientation changing operation, the nozzle sections 43 are not swung, and are held in the downward orientation state.

In the suction nozzle 40 of the present embodiment described above, since the nozzle section 43 which sucks the component is swingably provided on the nozzle holder section 41 which is held on the mounting head 14, and an orientation of the nozzle section 43 is configured so as to be able to be changed by 90° to a downward orientation or a lateral orientation by swinging the nozzle section 43, it is possible to suck the component to the nozzle section 43 from above in a state in which the orientation of the nozzle section 43 is the downward orientation in the component suction operation, and mount the component on the object such as the circuit board and the like in a state in which the orientation (posture) of the component that is sucked by the nozzle section 43 is set to the lateral orientation by the nozzle section 43 the orientation of which is changed by 90° to the lateral orientation by swinging the nozzle section 43 in the component mounting operation. As a result, even in a case where the posture of the component on a commercially available tray which is acquired from a manufacturer or a vendor is 90° different from the posture in which the component is to be mounted, it is not necessary for an operator to perform work in which the component on the commercially available tray is transferred to a dedicated tray, it is possible to use the commercially available tray without change, and component replenishment work is easy. Here, in a case where the posture of the component on the commercially available tray is the same as the posture in which the component is to be mounted, after the component is sucked, without changing the orientation of the nozzle section 43, the component may be mounted on the object such as the circuit board.

Furthermore, in the present embodiment, since the downward orientation and lateral orientation states of the nozzle section 43 are respectively held using magnetic force of the magnets 68 and 69, it is advantageous in that the configuration is simple, deterioration over time such as wear and the like is slight, and durability is superior in comparison to a configuration of being held by the engaging means.

Moreover, even if it is not possible to swing the nozzle section 43 by 90° in the orientation change operation of the nozzle section 43, since it is possible to bring the magnet 68 or 69 closer to a magnetic member 70 or 71 of a counterpart side by swing of the nozzle section 43 up to that point, it is possible to attract the magnet 68 or 69 to the magnetic member 70 or 71 using a magnetic attraction force of the magnet 68 or 69, and it is possible to reliably swing the nozzle section 43 by 90°.

However, the present disclosure may even be configured to hold the nozzle section 43 by engaging means in a state of being set in the downward orientation and in a state of being set in the lateral orientation respectively, even in this case, it is possible to realize an above object of the present disclosure.

In addition, in the present embodiment, since the orientation of the nozzle sections 43 of two suction nozzles 40 are caused to be changed by 90° by holding two suction nozzles 40 on the mounting head 14, and moving the nozzle sections 43 of the two suction nozzles 40 horizontally or downwardly by the mounting head 14 while the mounting head 14 contacts the nozzle sections 43 on the nozzle orientation change member 81, it is possible to simultaneously perform the orientation change operation of the nozzle sections 43 of the two suction nozzles 40 using one mounting head 14, and it is possible to efficiently perform the orientation change operation of the nozzle sections 43 of the two suction nozzles 40 in time for changing orientation of a nozzle section having one suction nozzle 40.

Here, the present disclosure may be configured to hold three or more suction nozzles 40 on one mounting head 14, and of course, may be configured to hold only one suction nozzle 40 on one mounting head 14.

In addition, in the present embodiment, since the component is imaged by the component imaging camera 17 from below in a state in which the orientation of the component which is sucked by the nozzle section 43 is set in the lateral orientation by changing the orientation of the nozzle section 43 by 90° laterally, the amount of deviation in the horizontal direction of the component suction position of the nozzle section 43 is calculated by processing the image using the image processing unit 95, and a command value of the mounting position of the component is corrected according to the amount of deviation in the horizontal direction of the component suction position, and even if the component suction position of the nozzle section 43 is deviated, it is possible to precisely mount the component at the target mounting position by automatically correcting the command value of the mounting position of the component according to the amount of deviation of the component suction position.

The present disclosure may be configured to provide a driving source (motor, solenoid, and an actuator such as an air cylinder) which swings the nozzle section 43 on the suction nozzle 40, but in this configuration, there is a disadvantage in that the configuration of the suction nozzle 40 is complex.

Therefore, in the present embodiment, when the orientation of the nozzle section 43 is caused to be changed by 90°, the nozzle section 43 are moved horizontally or downwardly while the nozzle section 43 contacts on the nozzle orientation change member 81 which is provided in the component mounting machine 11 so that the orientation of the nozzle section 43 is changed by 90°, therefore it is advantageous in that it is not necessary to provide a driving source which swings the nozzle section 43 on the suction nozzle 40, and the configuration of the suction nozzle 40 is simplified.

Moreover, in the present embodiment, since the elastically deformable buffer member 72 is provided on a portion of the nozzle section 43 on which the nozzle orientation change member 81 contacts, it is possible to buffer a collision of the nozzle section 43 and the nozzle orientation change member 81 in the orientation change operation using the buffer member 72, and it is possible to suppress deterioration over time of the suction nozzle 40 due to the orientation change operation.

In addition, since the nozzle section 43 is configured so as to support on the nozzle holder section 41 to be movable up and down, and the nozzle section 43 is biased downwardly by the spring force of the spring 58, it is possible to absorb an impact force which acts on the nozzle section 43 and the component using the spring 58 in component suction or in mounting, and it is possible to prevent damage to the nozzle section 43 and the component.

Here, in order to reliably mount the component which is sucked by the suction nozzle 40 on the circuit board or the like, it is necessary to press down the component on the circuit board or the like, but since the suction nozzle 40 of the present embodiment mounts the component on the circuit board or the like in a state in which the component is sucked by the nozzle section 43 from the side, it is not possible to press down the component on the circuit board or the like from above at a leading end of the nozzle section 43, and it is necessary to press down the component on the circuit board or the like only by suction force of the nozzle section 43. For this reason, when the suction force of the nozzle section 43 is weak, it is likely to unintentionally remove the component from the nozzle section 43 in the component mounting operation, and the component mounting operation becomes unstable.

Therefore, in the present embodiment, the two nozzle sections 43 are provided on the nozzle holder section 41, and one component is sucked using the two nozzle sections 43. Thereby, since it is possible to stably suck one component using the two nozzle sections 43, it is possible to increase the suction force with respect to one component, and it is possible to prevent the component from being unintentionally removed from the nozzle section 43 in the component mounting operation, while it is also possible to increase force at which the component is pressed down on the circuit board or the like, and it is possible to stabilize the component mounting operation.

Here, the present disclosure may be configured such that the three or more nozzle sections 43 are provided on the nozzle holder section 41, and of course, may be configured to be provided with only one nozzle section 43 on the nozzle holder section 41, and even in this case, a pad shape of the nozzle section 43 may be increased, and the suction force may increase by increasing the negative pressure which is supplied to the nozzle section 43.

In addition, in the present embodiment, since the air cylinder 82 is provided which moves the nozzle orientation change member 81, when the orientation of the nozzle section 43 of the suction nozzle 40 is caused to be changed by 90°, the nozzle orientation change member 81 is moved by the air cylinder 82 to a position where the nozzle section 43 is able to contact on the nozzle orientation change member 81, the orientation of the nozzle section 43 is changed by 90°, and after the orientation change is completed, the nozzle orientation change member 81 is retreated by the air cylinder 82 to a position where the nozzle orientation change member 81 does not interfere with the suction nozzle 40, and it is possible to reliably prevent the suction nozzle 40 from interfering with the nozzle orientation change member 81 during production after the orientation change of the nozzle section 43 is completed.

In addition, in the present embodiment, since the dimension data of the component which is sucked by the nozzle section 43 of the suction nozzle 40 is acquired from the database, and the amount of lowering of the suction nozzle 40 in the component suction operation and the amount of lowering of the suction nozzle 40 in the component mounting operation are calculated based on the dimension data of the component, it is possible to automatically and precisely set the amount of lowering of the suction nozzle 40 in the component suction operation and in the component mounting operation.

In this case, in the component mounting operation, deviation of the height position of the component in the lateral posture occurs due to deviation in the horizontal direction of the suction position of the component in the horizontal posture in the component suction operation, and after the component in the lateral posture which is sucked by the nozzle section 43 in the component mounting operation contacts the circuit board, deviation of the height position of the component in the lateral posture is absorbed by the nozzle section 43 being pushed up opposing spring force of the spring 58 according by lowering of the suction nozzle 40.

Here, measurement means may be provided which measures the height position of the component with a lateral posture that is sucked by the nozzle section 43, and the amount of lowering of the suction nozzle 40 in the component mounting operation may be set by measuring the height position of the component with a lateral posture using the measurement means. Here, for example, the measurement means may measure the height position of the component with a lateral posture using a length measurement sensor or the like, or alternatively, the height position of the component with a lateral posture may be measured by processing an image of the component with the lateral posture imaged by a camera from the lateral direction.

In addition, the present disclosure may be provided with a light sensor or the like which confirms the orientation of the nozzle section 43 of the suction nozzle 40 in the component mounting machine 11, the shape of the nozzle section 43 of the suction nozzle 40 or the shape of the buffer member 72 may be appropriately modified, and the like, and needless to say implementation is possible by making various modifications within a range which does not deviate from the gist of the present disclosure.

REFERENCE SIGNS LIST

11 . . . component mounting machine, 12 . . . component supply device, 13 . . . conveyor, 14 . . . mounting head, 15 . . . XY-axis moving mechanism, 17 . . . component imaging camera, 18 . . . mark imaging camera, 21, 22 . . . Z-axis motor, 23, 24 . . . Z-axis slide, 25 . . . X-axis motor, 26 . . . X-axis slide mechanism, 27 . . . Y-axis motor, 28 . . . Y-axis slide mechanism, 40 . . . suction nozzle, 41 . . . nozzle holder section, 43 . . . nozzle section, 44 . . . shaft pin, 45 . . . holding plate section, 47 . . . air passage, 52 . . . holding block, 53 . . . swingable block, 58 . . . spring (biasing device), 59 . . . air pressure introduction hole, 61 to 64 . . . air passage, 68, 69 . . . magnet, 70, 71 . . . magnetic member, 72 . . . buffer member, 80 . . . nozzle orientation change unit, 81 . . . nozzle orientation change member, 82 . . . air cylinder (movement device), 84 . . . lifting and lowering shaft, 91 . . . control device, 95 . . . image processing unit (image processing device)

The invention claimed is:

1. A component mounting machine, comprising:
a mounting head;
a suction nozzle held on the mounting head, the suction nozzle configured to suck and mount a supplied component to an object, the suction nozzle including a nozzle holder section held on the mounting head, and a nozzle section configured to suck the component and is swingably provided on the nozzle holder section, and an orientation of the nozzle section is configured to be changed by 90° between a downward orientation and a lateral orientation by swinging the nozzle section, the nozzle section being configured to mount the component in each of the downward orientation and the lateral orientation;
a camera configured to image the component from below which is sucked by the nozzle section;
an image processing device configured to process the image captured by the camra and configured to recognize the component; and
a control device configured to
control the nozzle section to suck the component from above in a state in which the orientation of the nozzle section is the downward orientation in a component suction operation,
control the nozzle section to swing by 90° to change the orientation of the component sucked by the nozzle section to the lateral orientation, control the camera to image the component in the lateral orientation from below, control the image processing device to process the image of the component in the lateral orientation to calculate an amount of deviation of a component suction position of the nozzle section, and control the suction nozzle to mount the component in the lateral orientation on the object based on the amount of deviation calculated by the image processing device in a component mounting operation.

2. The component mounting machine according to claim 1, comprising:

at least one magnet which holds the nozzle section by magnetic force in the state of being set in the downward orientation and in the state of being set in the lateral orientation respectively.

3. The component mounting machine according to claim 2, wherein the magnet functions as a stopper which limits a swingable range of the nozzle section to 90°.

4. The component mounting machine according to claim 1, wherein the orientation of the nozzle section is caused to be changed by 90° by moving the nozzle section horizontally or downwardly while contacting the nozzle section on a nozzle orientation change member which is provided in the component mounting machine when the orientation of the nozzle section is caused to be changed by 90°.

5. The component mounting machine according to claim 4, wherein an elastically deformable buffer member is provided on a portion of the nozzle section on which the nozzle orientation change member contacts.

6. The component mounting machine according to claim 4, comprising:

movement device for moving the nozzle orientation change member, wherein when the orientation of the nozzle section is caused to be changed by 90°, the nozzle orientation change member is moved by the movement device to a position where the nozzle orientation change member contacts the nozzle section, and the mounting head moves the nozzle section horizontally or downwardly while the mounting head contacts the nozzle section on the nozzle orientation change member, and after the orientation change is completed, the nozzle orientation change member is retreated by the movement device to a position where the nozzle orientation change member does not interfere with the suction nozzle.

7. The component mounting machine according to claim 6, wherein the plurality of suction nozzles are held on the mounting head, and the orientation of the nozzle sections of the plurality of suction nozzles are caused to be changed by 90° by moving the nozzle sections of the plurality of suction nozzles horizontally or downwardly by the mounting head while the mounting head contacts the nozzle sections on the nozzle orientation changing member.

8. The component mounting machine according to claim 1, wherein the nozzle holder section is configured so as to support the nozzle section to be movable up and down, and has the biasing device which biases the nozzle section downwardly.

9. The component mounting machine according to claim 1, wherein a plurality of the nozzle sections are provided on the nozzle holder section, and one component is sucked using the plurality of nozzle sections.

10. The component mounting machine according to claim 1, wherein a command value of a mounting position of the component is corrected according to the amount of deviation of the component suction position.

11. The component mounting machine according to claim 1, wherein component data in which dimension data of the component is included is registered in a database, and the amount of lowering of the suction nozzle in the component suction operation and the amount of lowering of the suction nozzle in the component mounting operation are calculated based on the dimension data of the component by acquiring the dimension data of the component sucked by the nozzle section from the database.

12. A suction nozzle which is held on a mounting head of a component mounting machine that sucks and mounts a supplied component to an object, comprising:

a nozzle section that sucks the component is swingably provided on a nozzle holder section which is held on the mounting head, and an orientation of the nozzle section is changed by 90° to a downward orientation or a lateral orientation by swinging the nozzle section, and at least one magnet which holds the nozzle section by magnetic force in the state of being set in the downward orientation and in the state of being set in the lateral orientation respectively, wherein the nozzle section sucks the component from above in a state in which the orientation of the nozzle section is the downward orientation in a component suction operation, and the component is mounted on the object in a state in which the orientation of the component that is sucked by the nozzle section is set to the lateral orientation by the nozzle section the orientation of which is changed by 90° to the lateral orientation by swinging the nozzle section in the component mounting operation, and wherein the magnet functions as a stopper which limits a swingable range of the nozzle section to 90°.

13. A suction nozzle which is held on a mounting head of a component mounting machine that sucks and mounts a supplied component to an object, comprising:

a nozzle section that sucks the component is swingably provided on a nozzle holder section which is held on the mounting head, and an orientation of the nozzle section is changed by 90° to a downward orientation or a lateral orientation by swinging the nozzle section, wherein the nozzle section sucks the component from above in a state in which the orientation of the nozzle section is the downward orientation in a component suction operation, and the component is mounted on the object in a state in which the orientation of the component that is sucked by the nozzle section is set to the lateral orientation by the nozzle section the orientation of which is changed by 90° to the lateral orientation by swinging the nozzle section in the component mounting operation, wherein the orientation of the nozzle section is caused to be changed by 90° by moving the nozzle section horizontally or downwardly while contacting the nozzle section on a nozzle orientation change member which is provided in the component mounting machine when the orientation of the nozzle section is caused to be changed by 90°, and wherein an elastically deformable buffer member is provided on a portion of the nozzle section on which the nozzle orientation change member contacts.

14. A component mounting machine, comprising:

a mounting head a suction nozzle held on the mounting head, the suction nozzle configured to suck and mount a supplied component to an object, the suction nozzle including a nozzle holder section held on the mounting head, and a nozzle section configured to suck the component and swingably provided on the nozzle holder section, and an orientation of the nozzle section is configured to be changed by 90° to a downward orientation or a lateral orientation by swinging the nozzle section;

a motor configured to move the suction nozzle down;

a camera configured to image from below the component from below which is sucked by the nozzle section;

an image processing device configured to process the image captured by the camera and configured to recognize the component; and a control device configured to control the nozzle section to suck the component from above in a state in which the orientation of the nozzle section is the downward orientation in a component suction operation, control the nozzle section to swing by 90° to change the orientation of the component sucked by the nozzle section to the lateral orientation, control the camera to image the component in the lateral orientation from below, control the image processing device to process the image of the component in the lateral orientation to calculate an amount of deviation of a component suction position of the component sucked by the nozzle section, and control the suction nozzle to mount the component in the lateral orientation on the object based on the amount of deviation calculated by the image processing device in a component mounting operation, wherein the motor moves the suction nozzle down to a height position at which the component in the lateral orientation sucked by the nozzle section is pressed on the object.

* * * * *